(12) United States Patent
Song et al.

(10) Patent No.: US 12,185,575 B2
(45) Date of Patent: Dec. 31, 2024

(54) DISPLAY DEVICE

(71) Applicant: LG Display Co., Ltd., Seoul (KR)

(72) Inventors: JiHun Song, Seoul (KR); Hoiyong Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 155 days.

(21) Appl. No.: 17/379,055

(22) Filed: Jul. 19, 2021

(65) Prior Publication Data

US 2022/0037625 A1 Feb. 3, 2022

(30) Foreign Application Priority Data

Jul. 31, 2020 (KR) ........................ 10-2020-0095960

(51) Int. Cl.
*H10K 50/86* (2023.01)
*H10K 50/84* (2023.01)

(52) U.S. Cl.
CPC ............. *H10K 50/86* (2023.02); *H10K 50/84* (2023.02)

(58) Field of Classification Search
CPC .. H10K 50/86; H10K 50/84; H10K 2102/311; H10K 59/50; G03B 21/58; G03B 21/604; G02B 5/3025; G02F 1/133528; G02F 1/133388; G02F 2201/501; G02F 2201/54; G02F 1/133305; G06F 1/1601; G06F 1/1652; H01L 25/0753; G09F 9/301
See application file for complete search history.

(56) References Cited

U.S. PATENT DOCUMENTS

| | | |
|---|---|---|
| 2004/0137224 A1 | 7/2004 | Kusumoto et al. |
| 2008/0186576 A1* | 8/2008 | Takada .................. G02B 5/3025 349/5 |
| 2013/0193832 A1* | 8/2013 | Jung ....................... H10K 50/86 156/60 |
| 2015/0339563 A1* | 11/2015 | Park ................... G02F 1/133512 235/492 |
| 2016/0299380 A1* | 10/2016 | Nam .................. G02F 1/133528 |
| 2017/0156225 A1* | 6/2017 | Heo ...................... H05K 5/0217 |
| 2018/0024399 A1* | 1/2018 | Han ................... G02F 1/133536 349/43 |
| 2018/0040268 A1 | 2/2018 | Murai |

FOREIGN PATENT DOCUMENTS

| | | |
|---|---|---|
| JP | 2020-98326 A | 6/2020 |
| KR | 10-2013-0136805 A | 12/2013 |
| KR | 10-2017-0041792 A | 4/2017 |
| KR | 10-2017-0062896 A | 6/2017 |
| KR | 10-2020-0073387 A | 6/2020 |
| KR | 10-2020-00733787 A | 6/2020 |

* cited by examiner

*Primary Examiner* — Mariam Qureshi
(74) *Attorney, Agent, or Firm* — Seed IP Law Group LLP

(57) ABSTRACT

The display device includes a display panel including an active area and a non-active area; and a polarization plate on the display panel, the polarization plate including a polarization layer. The polarization layer includes a first pattern corresponding to the active area and a second pattern corresponding to the non-active area, and the second pattern is spaced apart from the first pattern. Thus, it is possible to delay moisture absorption of a polarization layer.

21 Claims, 16 Drawing Sheets

DISPLAY DEVICE

CROSS-REFERENCE TO RELATED APPLICATIONS

This application claims the priority of Korean Patent Application No. 10-2020-0095960 filed on Jul. 31, 2020, in the Korean Intellectual Property Office, the disclosure of which is incorporated herein by reference.

BACKGROUND

Technical Field

The present disclosure relates to a display device, and more particularly, to a rollable display device in which warpage of a display panel caused by moisture may be improved.

Description of the Related Art

Display devices employed by the monitor of a computer, a TV, a mobile phone or the like include an organic light emitting display (OLED) that emits light by itself, and a liquid crystal display (LCD) with a separate light source.

As the display devices have been increasingly applied to diverse fields such as a computer monitor, a TV, and a personal mobile device, display devices having a large display area and a reduced volume and weight have been studied.

Further, recently, rollable display devices have attracted attention as a next-generation display device.

BRIEF SUMMARY

An object to be achieved by the present disclosure is to provide a display device in which moisture absorption of a polarization plate can be minimized.

Another object to be achieved by the present disclosure is to provide a display device in which moisture permeation occurring through side surfaces of a display panel and a polarization plate can be minimized.

Yet another object to be achieved by the present disclosure is to provide a display device in which warpage of a display panel caused by moisture absorption of a polarization plate can be improved.

Still another object to be achieved by the present disclosure is to provide a display device in which cracks in a substrate of a display panel caused by moisture absorption of a polarization plate can be suppressed.

Objects of the present disclosure are not limited to the above-mentioned objects, and other objects, which are not mentioned above, can be clearly understood by those skilled in the art from the following descriptions.

According to an aspect of the present disclosure, the display device includes a display panel including an active area and a non-active area; and a polarization plate on the display panel, the polarization plate including a polarization layer. The polarization layer includes a first pattern corresponding to the active area and a second pattern corresponding to the non-active area, and the second pattern is spaced apart from the first pattern. The display device may also include a display part, wiring lines and other like structures on a flexible substrate made of flexible plastic and which may display an image even in a rolled configuration.

According to another aspect of the present disclosure, the display device includes a display panel including an active area and a non-active area; a polarization plate on the display panel, the polarization plate including a polarization layer; protection layers respectively disposed on opposite surfaces of the polarization layer; and a roller coupled to the display panel and configured to wind or unwind the display panel. The polarization layer includes a first pattern corresponding to the active area, and a second pattern corresponding to the non-active area and surrounding the first pattern. The first pattern and the second pattern are spaced apart from each other by at least one of the protection layers.

Other detailed matters of the exemplary embodiments are included in the detailed description and the drawings.

According to the present disclosure, a barrier film is disposed to surround side portions of a display panel and a polarization plate. Thus, it is possible to suppress moisture permeation.

According to the present disclosure, a polarization layer corresponding to a non-active area is patterned. Thus, it is possible to delay moisture permeation occurring through the polarization layer.

According to the present disclosure, it is possible to suppress warpage of a display panel and cracks in a substrate by suppressing moisture absorption of a polarization layer.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
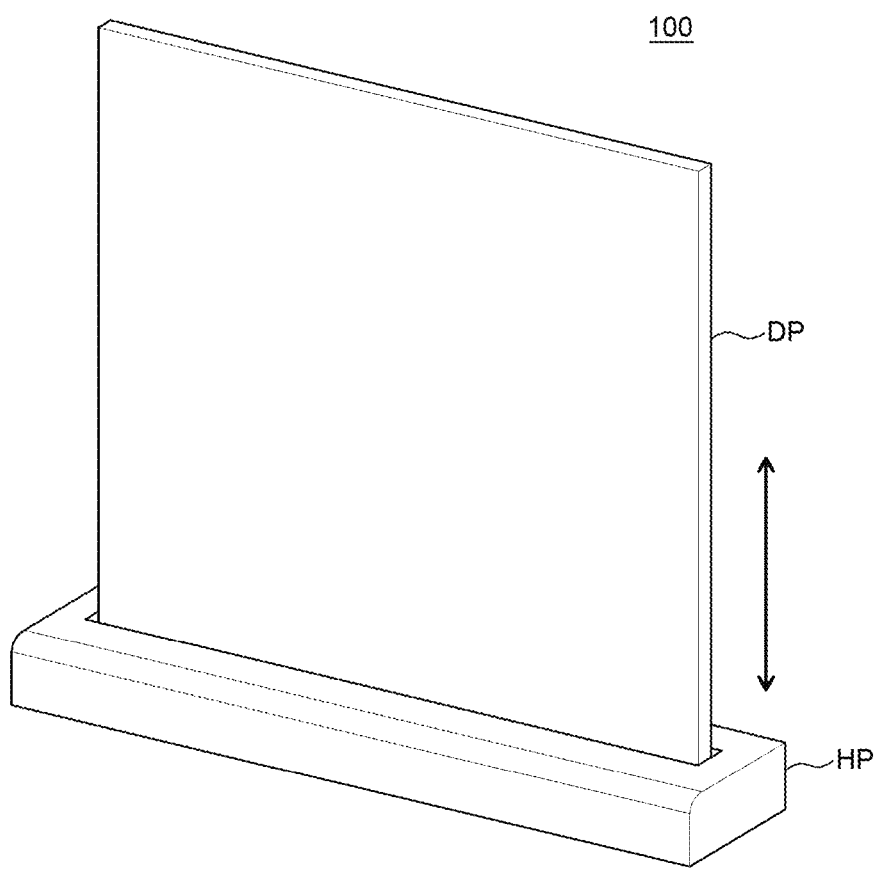
FIG. 1A and FIG. 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Display Device-Rollable Display Device

A rollable display device may refer to a display device which can display an image even when rolled up. The rollable display device may have higher flexibility than conventional typical display devices. The rollable display device can be freely changed in shape depending on whether the rollable display device is used or not. Specifically, when the rollable display device is not used, the rollable display device can be housed as rolled up to reduce its volume. When the rollable display device is used, the rolled rollable display device can be unrolled again to be used.

Figure 1B:
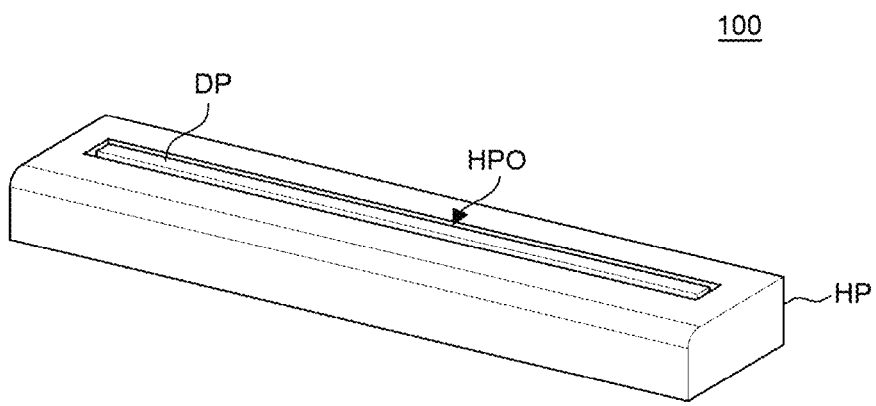

FIG. 1A and FIG. 1B are perspective views of a display device according to an exemplary embodiment of the present disclosure. Referring to FIG. 1A and FIG. 1B, a display device 100 according to an exemplary embodiment of the present disclosure includes a display part DP and a housing part HP.

The display part DP is configured to display images to a user. For example, display elements, circuits for driving the display elements, wiring lines, components, and the like may be disposed in the display part DP. Herein, the display device 100 according to an embodiment of the present disclosure is a rollable display device. Therefore, the display part DP may be configured to be wound or unwound. For example, the display part DP may include a display panel and a back cover which are flexible so as to be wound or unwound. More details of the display part DP will be described later with reference to FIG. 4 through FIG. 6.

The housing part HP serves as a case where the display part DP may be housed. The display part DP may be wound and then housed inside the housing part HP, and the display part DP may be unwound and then presented outside the housing part HP.

The housing part HP includes an opening HPO through which the display part DP may move in and out of the housing part HP. The display part DP may move up and down through the opening HPO of the housing part HP.

Meanwhile, the display part DP of the display device 100 may transition from a full unwinding state to a full winding state, and vice versa.

FIG. 1A shows a full unwinding state of the display part DP of the display device 100. The full unwinding state refers to a state where the display part DP of the display device 100 is presented outside the housing part HP. That is, the full unwinding state may be defined as a state where the display part DP is unwound to a maximum so as not to be further unwound and presented outside the housing part HP in order for the user to watch images on the display device 100.

FIG. 1B shows a full winding state of the display part DP of the display device 100. The full winding state refers to a state where the display part DP of the display device 100 is housed inside the housing part HP and may not be further wound. That is, the full winding state may be defined as a state where the display part DP is wound and housed inside the housing part HP when the user does not watch images on the display device 100 because the display part DP housed inside the housing part HP is preferable for the sake of external appearance. Further, in the full winding state where the display part DP is housed inside the housing part HP, the display device 100 is reduced in volume and easy to transport.

Meanwhile, a moving part for winding or unwinding the display part DP to change the display part DP to the full unwinding state or the full winding state is provided.

Moving Part

Figure 2:
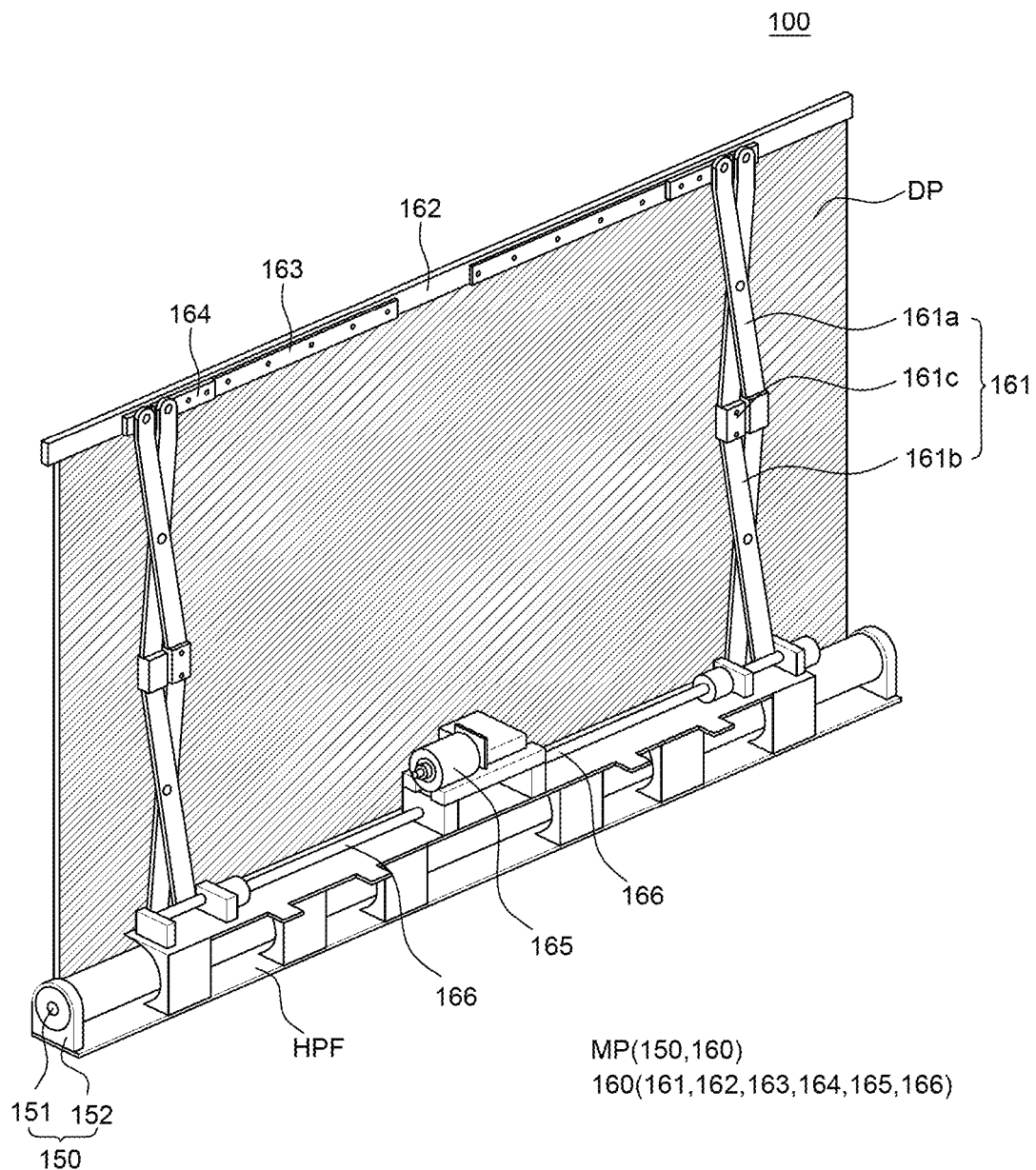
FIG. 2 is a perspective view of the display device according to an exemplary embodiment of the present disclosure.
Figure 3:
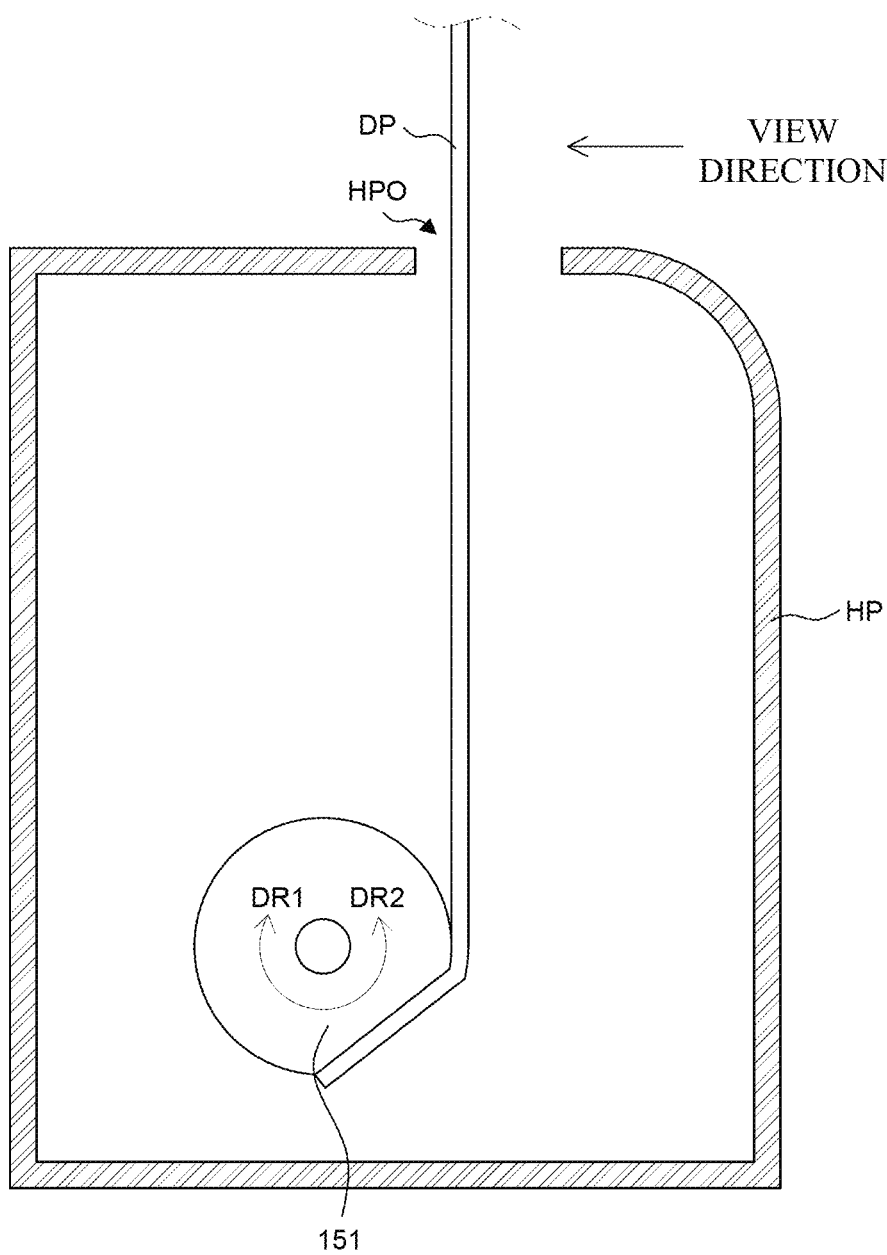
FIG. 3 is a cross-sectional view of the display device according to an exemplary embodiment of the present disclosure.

FIG. 2 is a perspective view of the display device according to an exemplary embodiment of the present disclosure. FIG. 3 is a cross-sectional view of the display device according to an exemplary embodiment of the present disclosure. FIG. 3 is a schematic cross-sectional view provided to explain a roller 151 and the display part DP of the display device 100 according to an exemplary embodiment of the present disclosure. For convenience of description, FIG. 3 illustrates only the housing part HP, the roller 151, and the display part DP.

First, referring to FIG. 2, a moving part MP includes a roller unit 150 and an elevating unit 160.

The roller unit 150 winds or unwinds the display part DP fixed to the roller unit 150 while rotating clockwise or counterclockwise. The roller unit 150 includes the roller 151 and a roller support 152.

The roller 151 is a member around which the display part DP is wound. The roller 151 may have, e.g., a cylindrical shape. The lower edge of the display part DP may be fixed to the roller 151. When the roller 151 rotates, the display part DP whose lower edge is fixed to the roller 151 may be wound around the roller 151. On the contrary, when the roller 151 rotates in the opposite direction, the display part DP wound around the roller 151 may be unwound from the roller 151.

Referring to FIG. 3, the roller 151 may include at least a part of the outer peripheral surface having a flat surface and the other part of the outer peripheral surface having a curved surface. The roller 151 has a cylindrical shape overall but may be partially flat. That is, a part of the outer peripheral surface of the roller 151 is flat and the other part of the outer peripheral surface is curved. At least one flexible film 130 and a printed circuit board 140 of the display part DP may be mounted on the flat surface part of the roller 151. The roller 151 may be a completely cylindrical shape or may have any shape around which the display part DP may be wound, but is not limited thereto.

Referring to FIG. 2 again, the roller support 152 supports the roller 151 from both sides of the roller 151. Specifically, the roller supports 152 are placed on a bottom surface HPF of the housing part HP. Further, upper side surfaces of the respective roller supports 152 are combined with both ends of the roller 151. Thus, the roller support 152 may support the roller 151 so as to be spaced apart from the bottom surface HPF of the housing part HP. Herein, the roller 151 may be rotatably combined with the roller support 152.

The elevating unit 160 moves the display part DP up and down according to driving of the roller unit 150. The elevating unit 160 includes a link unit 161, a head bar 162, a slide rail 163, a slider 164, a motor 165, and a rotating unit 166.

The link unit 161 of the elevating unit 160 includes a plurality of links 161a and 161b and a hinge unit 161c that connects the plurality of links 161a and 161b. Specifically, the plurality of links 161a and 161b includes a first link 161a and a second link 161b. The first link 161a and the second link 161b are crossed in the form of scissors and rotatably hinged to each other via the hinge unit 161c. Thus, when the link unit 161 moves up and down, the plurality of links 161a and 161b may rotate in a direction to be farther from or closer to each other.

The head bar 162 of the elevating unit 160 is fixed to the uppermost end of the display part DP. The head bar 162 is connected to the link unit 161 and may move the display part DP up and down according to rotation of the plurality of links 161a and 161b of the link unit 161. That is, the display part DP may be moved up and down by the head bar 162 and the link unit 161.

The head bar 162 covers only a part of a surface adjacent to the uppermost edge of the display part DP so as not to cover images displayed on the front surface of the display part DP. The display part DP and the head bar 162 may be fixed by screws, but the present disclosure is not limited thereto.

The slide rail 163 of the elevating unit 160 provides travel paths of the plurality of links 161a and 161b. A part of the plurality of links 161a and 161b may be rotatably clamped to the slide rail 163 and its movement may be guided along the track of the slide rail 163. A part of the plurality of links 161a and 161b may be clamped to the slider 164 movably provided along the slide rail 163 and moved along the track of the slide rail 163.

The motor 165 may be connected to a power generation unit, such as a separate external power supply or a built-in battery, and supplied with power from the power generation unit. The motor 165 generates rotatory power and supplies driving force to the rotating unit 166.

The rotating unit 166 is connected to the motor 165 and configured to covert rotational movement of the motor 165 into linear reciprocal movement. That is, the rotating unit 166 may convert rotational movement of the motor 165 into linear reciprocal movement of a structure fixed to the rotating unit 166. For example, the rotating unit 166 may be implemented as a ball screw including a shaft and a nut clamped to the shaft, but is not limited thereto.

The motor 165 and the rotating unit 166 may elevate the display part DP in line with the link unit 161. The link unit 161 has a link structure and may receive driving force from the motor 165 and the rotating unit 166 and repeatedly perform folding and unfolding operations.

Specifically, when the motor 165 is driven, the structure of the rotating unit 166 may make linear movement. That is, a part of the rotating unit 166 connected to one end of the second link 161b may make linear movement. Thus, the one end of the second link 161b may move toward the motor 165. Also, the plurality of links 161a and 161b is folded, and, thus, the height of the link unit 161 may decrease. Further, while the plurality of links 161a and 161b is folded, the head bar 162 connected to the first link 161a is moved down. Also, one end of the display part DP connected to the head bar 162 is also moved down.

Therefore, when the display part DP is fully wound around the roller 151, the link unit 161 of the elevating unit 160 maintains a folded state. That is, when the display part DP is fully wound around the roller 151, the elevating unit 160 may have a minimum height. When the display part DP is fully unwound, the link unit 161 of the elevating unit 160 maintains an unfolded state. That is, when the display part DP is fully unwound, the elevating unit 160 may have a maximum height.

Meanwhile, when the display part DP is wound, the roller 151 may rotate and the display part DP may be wound around the roller 151. Referring to FIG. 3, as an example, the lower edge of the display part DP is connected to the roller 151. Further, when the roller 151 rotates in a first direction DR1, i.e., clockwise, the display part DP may be wound around the roller 151 so that a rear surface of the display part DP may be closely contacted with a surface of the roller 151.

When the display part DP is unwound, the roller 151 may rotate and the display part DP may be unwound from the roller 151. Referring to FIG. 3, as an example, when the roller 151 rotates in a second direction DR2, i.e., counterclockwise, the display part DP wound around the roller 151 may be unwound from the roller 151 and then presented outside the housing part HP.

In some embodiments, the moving part MP different in structure from the above-described moving part MP may also be applied to the display device 100. That is, the roller unit 150 and the elevating unit 160 described above may be changed in configuration as long as the display part DP may be wound and unwound. Some of their components may be omitted or other components may be added.

Display Part

Figure 4:
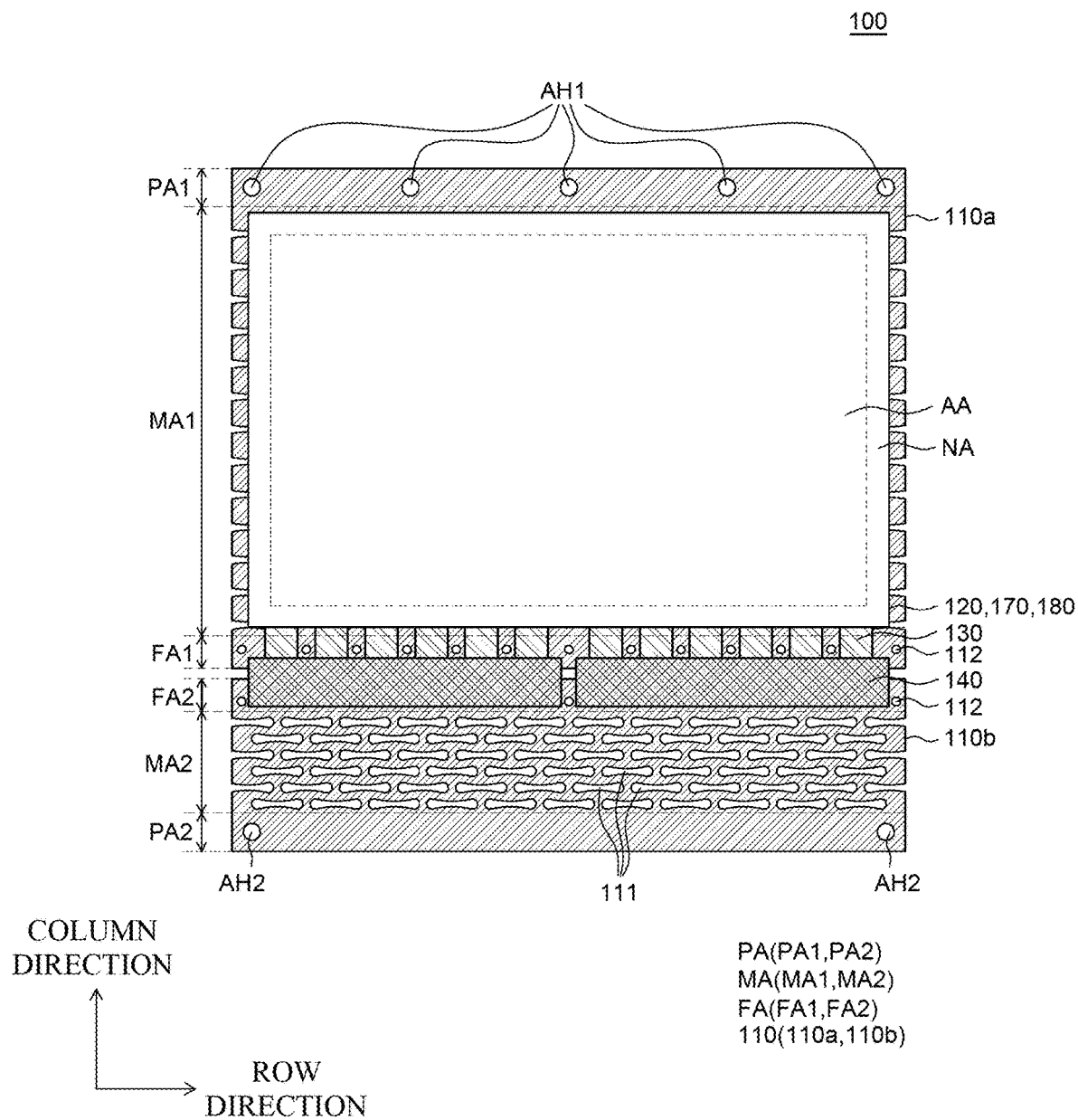
FIG. 4 is a plan view of a display part of the display device according to an exemplary embodiment of the present disclosure.
Figure 5:
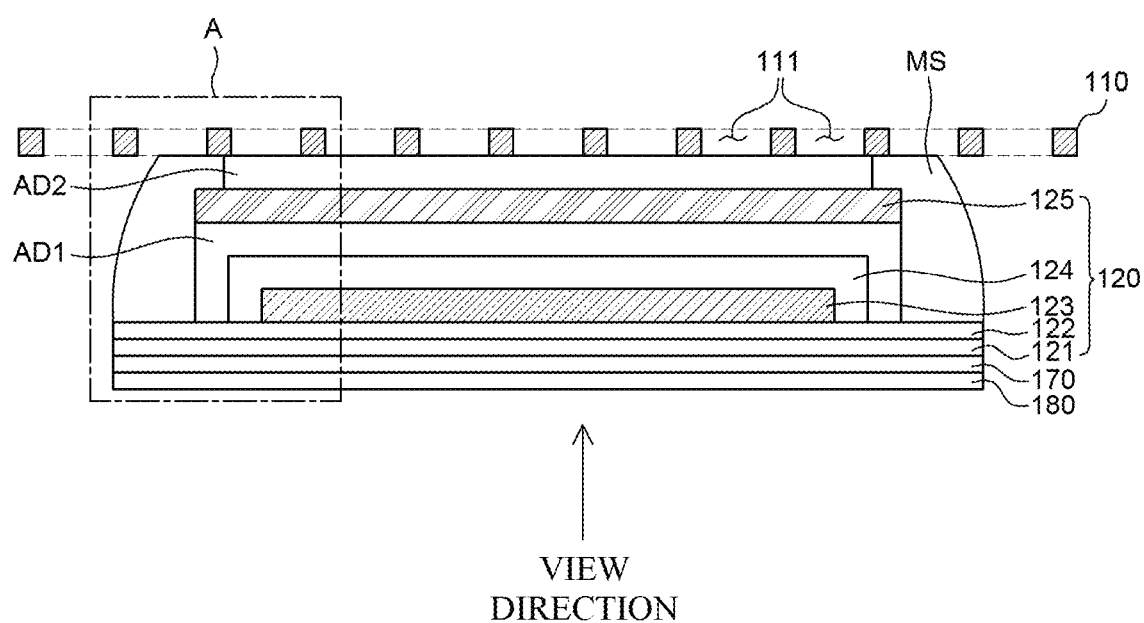
FIG. 5 is a cross-sectional view of the display part of the display device according to an exemplary embodiment of the present disclosure.

FIG. 4 is a plan view of the display part of the display device according to an exemplary embodiment of the present disclosure. FIG. 5 is a cross-sectional view of the display part of the display device according to an exemplary embodiment of the present disclosure.

Referring to FIG. 4, the display part DP includes the back cover 110, the display panel 120, the flexible film 130, the printed circuit board 140, a barrier film 170 and a polarization plate 180.

The display panel 120 is configured to display images to the user. In the display panel 120, display elements for displaying images, driving elements for driving the display elements, and wiring lines for transmitting various signals to the display elements and the driving elements may be disposed. The display elements may be defined differently depending on the kind of the display panel 120. For example, if the display panel 120 is an organic light emitting display panel, the display elements may be organic light emitting elements each composed of an anode, an organic emission layer, and a cathode. For example, if the display panel 120 is a liquid crystal display panel, the display elements may be liquid crystal display elements. Hereinafter, the display panel 120 will be assumed as an organic light emitting display panel, but the display panel 120 is not limited to the organic light emitting display panel. Further, since the display device 100 according to an embodiment of the present disclosure is a rollable display device, the display panel 120 may be implemented as a flexible display panel to be wound around or unwound from the roller 151.

The display panel 120 includes an active area AA and a non-active area NA.

The active area AA refers to an area where an image is displayed on the display panel 120. In the active area AA, a plurality of pixels including a plurality of sub-pixels and a circuit for driving the plurality of sub-pixels may be disposed. The plurality of sub-pixels is a minimum unit of the active area AA, and a display element may be disposed on each of the plurality of sub-pixels. For example, an organic light emitting element composed of an anode, an organic emission layer, and a cathode may be disposed on each of the plurality of sub-pixels, but the present disclosure is not limited thereto. Further, the circuit for driving the plurality of sub-pixels may include a driving element, a wiring line, and the like. For example, the circuit may be composed of a thin film transistor, a storage capacitor, a gate line, a data line, etc., but is not limited thereto.

The non-active area NA refers to an area where an image is not displayed. The non-active area NA may be extended from the active area AA. In the non-active area NA, various wiring lines, circuits, and the like for driving the organic light emitting elements in the active area AA may be disposed. For example, link lines for transmitting signals to the plurality of sub-pixels and circuits in the active area AA or driver ICs such as a gate driver IC and a data driver IC may be disposed in the non-active area NA. However, the present disclosure is not limited thereto.

The barrier film 170 and the polarization plate 180 may be disposed on the display panel 120. The barrier film 170 and the polarization plate 180 will be described later with reference to FIG. 6.

The flexible film 130 includes various components on a flexible base film and serves to supply signals to the plurality of sub-pixels and circuits in the active area AA. The flexible film 130 may be electrically connected to the display panel 120. The flexible film 130 is placed on one end of the non-active area NA of the display panel 120 and supplies power voltage, data voltage, etc., to the plurality of sub-pixels and circuits in the active area AA. The number of flexible films 130 illustrated in FIG. 4 is just an example and is not limited thereto. The number of flexible films 130 may be changed variously depending on the design and is not limited thereto.

Meanwhile, on the flexible film 130, driver ICs such as a gate driver IC and a data driver IC may be disposed. The driver ICs are components configured to process data for displaying an image and a driving signal for processing the data. The driver ICs may be mounted in a Chip On Glass (COG) method, a Chip On Film (COF) method, a Tape Carrier Package (TCP), or the like. For convenience of description, the driver ICs are described as mounted on the flexible film 130 in the COF method, but the present disclosure is not limited thereto.

The printed circuit board 140 is disposed on one end of the flexible film 130 and connected to the flexible film 130. The printed circuit board 140 is configured to supply signals to the driver ICs. The printed circuit board 140 supplies various signals such as a drive signal, a data signal, etc., to the driver ICs. In the printed circuit board 140, various components may be disposed. For example, a timing controller, a power supply unit, etc., may be disposed on the printed circuit board 140. Meanwhile, FIG. 4 illustrates two printed circuit boards 140. However, the number of printed circuit boards 140 is not limited thereto and may be changed variously depending on the design.

Meanwhile, although not illustrated in FIG. 4, an additional printed circuit board connected to the printed circuit board 140 may be further disposed. For example, the printed circuit board 140 may be referred to as a source printed circuit board (source PCB) S-PCB on which a data driver is mounted. The additional printed circuit board connected to the printed circuit board 140 may be referred to as a control printed circuit board (control PCB) C-PCB on which a timing controller or the like is mounted. The additional printed circuit board may be disposed inside the roller 151, or may be disposed within the housing part HP outside the roller 151.

The back cover 110 is disposed on rear surfaces of the display panel 120, the flexible film 130, and the printed circuit board 140 and supports the display panel 120, the flexible film 130, and the printed circuit board 140. Thus, the back cover 110 may be larger in size than the display panel 120. The back cover 110 may protect the other components of the display part DP against the external environment. The back cover 110 may be made of a rigid material, but at least a part of the back cover 110 may have flexibility so as to be wound or unwound along with the display panel 120. For example, the back cover 110 may be made of a metal material such as Steel Use Stainless (SUS) or Invar, or plastic. However, the material of the back cover 110 is not limited thereto. The material of the back cover 110 may be changed variously depending on the design as long as it may satisfy property requirements such as amount of thermal deformation, radius of curvature, rigidity, etc.

The back cover 110 includes a plurality of supporting areas PA, a fixing area FA and a plurality of flexible areas MA. In the plurality of supporting areas PA and the fixing area FA, a plurality of openings 111 is not disposed. In the plurality of flexible areas MA, the plurality of openings 111 is disposed. Specifically, a first supporting area PA1, a first flexible area MA1, the fixing areas FA1 and FA2, a second flexible area MA2 and a second supporting area PA2 are disposed in sequence from the uppermost end of the back cover 110.

The first supporting area PA1 of the back cover 110 is the uppermost area of the back cover 110 and clamped to the head bar 162. The first supporting area PA1 includes first alignment holes AH1 so as to be clamped to the head bar 162. In this case, the first supporting area PA1 may be clamped to head bar 162 by means of screws, but is not limited thereto. Since the first supporting area PA1 is clamped to the head bar 162, the back cover 110 may move up or down at the same time when the link unit 161 clamped to the head bar 162 moves up or down. The display panel 120 attached to the back cover 110 may also move up or down. FIG. 4 illustrates five first alignment holes AH1, but the number of first alignment holes AH1 is not limited thereto. Further, FIG. 4 illustrates that the back cover 110 is clamped to the head bar 162 using the first alignment holes AH1. However, the present disclosure is not limited thereto. Further, the back cover 110 may be clamped to the head bar 162 without alignment holes.

The first flexible area MA1 is extended from the first supporting area PA1 to the lower side of the back cover 110. In the first flexible area MA1, the plurality of openings 111 is disposed. The display panel 120 is attached to the first flexible area MA1.

When the display part DP is wound around the roller 151 so as to be housed inside the housing part HP, the first flexible area MA1 of the back cover 110 may be wound around the roller 151. A lower end portion and a central portion of the display panel 120 attached to the first flexible area MA1 may also be wound around the roller 151. Here, the first flexible area MA1 of the back cover 110 includes the plurality of openings 111. Thus, the first flexible area MA1 of the back cover 110 may have high flexibility and may be easily wound around the roller 151 together with the display panel 120.

The fixing area FA is extended from the first flexible area MA1 to the lower side of the back cover 110. The fixing area FA enables the flexible film 130 and the printed circuit board 140 to be wound so as not to be curved but to be flat around the roller 151 to protect the flexible film 130 and the printed circuit board 140. Further, the roller 151 may also be partially flat corresponding to the fixing area FA.

A plurality of fixing holes 112 is disposed in the fixing area FA. Each of the plurality of fixing holes 112 is disposed between flexible films 130. Thus, it is possible to more stably fix the flexible films 130 and the printed circuit board 140 to the fixing area FA. Meanwhile, the number of fixing holes 112 illustrated in FIG. 4 is just an example and may be determined based on the number of printed circuit boards 140, the number of flexible films 130, etc.

Meanwhile, the back cover 110 may be divided into a first back cover 110a and a second back cover 110b with a plurality of fixing holes 112 in a first fixing area FA1 and a plurality of fixing holes 112 in a second fixing area FA2 interposed therebetween. That is, the first back cover 110a includes the first supporting area PA1, the first flexible area MA1 and the first fixing area FA1, and the second back cover 110b includes the second fixing area FA2, the second flexible area MA2 and the second supporting area PA2. However, the present disclosure is not limited thereto. The back cover 110 may be formed as one body.

The second flexible area MA2 is extended from the fixing area FA to the lower side of the back cover 110. Further, in the second flexible area MA2, the plurality of openings 111 is disposed.

The second flexible area MA2 is extended to enable an active area AA of the display panel 120 to be presented outside the housing part HP. For example, when the back cover 110 and the display panel 120 are in the full unwinding state, an area ranging from the second supporting area PA2 of the back cover 110 fixed to the roller 151 to the fixing area FA to which the flexible film 130 and the printed circuit board 140 are attached may be placed inside the housing part HP. At the same time, the first flexible area MA1 to which the display panel 120 is attached and the fixing area FA may be presented outside the housing part HP. In this case, if a length from the second supporting area PA2 fixed to the roller 151 to the second flexible area MA2 and the fixing area FA is smaller than a length from the second supporting area PA2 to the opening HPO of the housing part HP, a part of the first flexible area MA1 to which the display panel 120 is attached may be placed inside the housing part HP. Thus, since a part of a lower end of the active area AA of the display panel 120 is placed inside the housing part HP, it may be difficult to watch images. Therefore, the length from the second supporting area PA2 fixed to the roller 151 to the second flexible area MA2 and the fixing area FA may be designed to be equal to the length from the second supporting area PA2 fixed to the roller 151 to the opening HPO of the housing part HP.

The second supporting area PA2 of the back cover 110 is the lowermost area of the back cover 110 and clamped and fixed to the roller 151. The second supporting area PA2 may include second alignment holes AH2 so as to be clamped to the roller 151. In this case, the second supporting area PA2 may be clamped to the roller 151 by screws, but is not limited thereto. Since the second supporting area PA2 is clamped to the roller 151, the back cover 110 may be wound around or unwound from the roller 151 as the roller 151 is rotated. FIG. 4 illustrates two second alignment holes AH2, but the number of second alignment holes AH2 is not limited thereto. Also, FIG. 4 illustrates that the back cover 110 is clamped to the roller 151 using the second alignment holes AH2. However, the present disclosure is not limited thereto. The back cover 110 may be fixed to the roller 151 without alignment holes.

The flexible area MA of the back cover 110 is wound around or unwound from the roller 151 along with the display panel 120. The flexible area MA may overlap at least the display panel 120 among the other components of the display part DP.

The plurality of openings 111 is disposed in the flexible area MA of the back cover 110. During winding or unwinding of the display part DP, the plurality of openings 111 may be deformed by stress applied to the display part DP. Specifically, during winding or unwinding of the display part DP, the flexible area MA of the back cover 110 may be deformed as the plurality of openings 111 contracts or expands. Further, since the plurality of openings 111 contracts or expands, a slip phenomenon of the display panel 120 disposed on the flexible area MA of the back cover 110 may be minimized. Therefore, stress applied to the display panel 120 may be minimized.

Referring to FIG. 4, the plurality of openings 111 is misaligned with the plurality of openings 111 of adjacent rows. For example, the plurality of openings 111 of one row is misaligned with the plurality of openings 111 of rows adjacent to the corresponding row. Specifically, the centers of plurality of openings 111 in odd-numbered rows may be misaligned with the centers of the plurality of openings 111 in even-numbered rows by as much as, e.g., ½ of a row-direction width of each opening 111. The placement of the plurality of openings 111 shown in FIG. 4 is just an example, but is not limited thereto.

In this case, the plurality of openings 111 formed in the flexible area MA is not formed in the first supporting area PA1 and the second supporting area PA2. That is, only the first alignment holes AH1 and the second alignment holes AH2 are formed in each of the first supporting area PA1 and the second supporting area PA2. However, the plurality of openings 111 formed in the flexible area MA is not formed in the first supporting area PA1 and the second supporting area PA2. Further, the first alignment holes AH1 and the second alignment holes AH2 are different in shape from the plurality of openings 111. The first supporting area PA1 and the second supporting area PA2 are fixed to the head bar 162 and the roller 151, respectively. Thus, the first supporting area PA1 and the second supporting area PA2 need to have higher rigidity than the flexible area MA. Specifically, since the first supporting area PA1 and the second supporting area PA2 have rigidity, the first supporting area PA1 and the second supporting area PA2 may be securely fixed to the head bar 162 and the roller 151. Therefore, the display part DP is fixed to the roller 151 and the head bar 162 of the moving part MP and may move in and out of the housing part HP according to an operation of the moving part MP.

In the display device 100 according to an embodiment of the present disclosure, the back cover 110 including the plurality of openings 111 is disposed on the rear surface of the display panel 120 to support and protect the display panel 120. The back cover 110 may be made of a metal material and thus may have rigidity. Also, the flexible area MA of the back cover 110 in which the display panel 120 is disposed includes the plurality of openings 111, and, thus, the back cover 110 may have improved flexibility. Therefore, in the full unwinding state in which the display part DP of the display device 100 is presented outside the housing part HP, the back cover 110 made of a rigid material and having high rigidity may support the display panel 120 to be spread flat. On the contrary, in the full winding state in which the display part DP of the display device 100 is housed inside the housing part HP, the back cover 110 having high flexibility due to the plurality of openings 111 may be wound around the roller 151 and housed together with the display panel 120.

Further, in the display device 100 according to an exemplary embodiment of the present disclosure, the back cover 110 includes the first back cover 110a and the second back cover 110b spaced apart from each other. Thus, the back cover 110 may be formed so as to correspond to various sizes of the display panel 120. As the size of the display device 100 increases, the size of the display panel 120 also increases. In this case, the back cover 110 needs to be larger in size than the display panel 120. Therefore, the single back cover 110 needs to be manufactured to a large size. However, it is very difficult to manufacture the single back cover 110 corresponding to a large-size display device in the manufacturing process. Accordingly, in the display device 100 according to an exemplary embodiment of the present disclosure, the back cover 110 is configured including the first back cover 110a and the second back cover 110b. Thus, the first back cover 110a and the second back cover 110b which are smaller in size than the display device 100 may be used. Meanwhile, although not illustrated in the drawings, a base plate, a bottom cover, a top cover and a fixing member are used to fix the first back cover 110a and the second back cover 110b.

Referring to FIG. 5, the back cover 110 is disposed on the rear surface of the display panel 120, and the barrier film 170 and the polarization plate 180 are disposed on a front surface of the display panel 120. Herein, the front surface of the display panel 120 may refer to a surface corresponding to a view direction, and the rear surface of the display panel 120 may refer to a surface on the opposite side to the view direction.

The display panel 120 includes a substrate 121, a buffer layer 122, a pixel unit 123, an encapsulation layer 124, and an encapsulation substrate 125.

The substrate 121 serves as a base member to support various components of the display panel 120 and may be made of an insulating material. The substrate 121 may be made of a flexible material in order for the display panel 120 to be wound or unwound. For example, the substrate 121 may be made of a plastic material such as polyimide (PI).

The buffer layer 122 may suppress diffusion of moisture and/or oxygen permeating from the outside of the substrate 121. The buffer layer 122 may be formed as a single layer or a multilayer of silicon oxide (SiOx) and silicon nitride (SiNx), but is not limited thereto.

The pixel unit 123 includes a plurality of organic light emitting elements and circuits for driving the organic light emitting elements. The pixel unit 123 may correspond to the active area AA. Each organic light emitting element may include an anode, an organic emission layer, and a cathode.

The anode may supply holes into the organic emission layer and may be made of a conductive material having a high work function. For example, the anode may be made of tin oxide (TO), indium tin oxide (ITO), indium zinc oxide (IZO), indium zinc tin oxide (ITZO), or the like, but is not limited thereto.

The organic emission layer may receive holes from the anode and electrons from the cathode and emit light. The organic emission layer may be one of a red organic emission layer, a green organic emission layer, a blue organic emission layer, a white organic emission layer, and the like depending on the color of light emitted from the organic emission layer. At this time, if the organic emission layer is a white organic emission layer, color filters of various colors may be further provided.

The cathode may supply electrons into the organic emission layer and may be made of a conductive layer having a low work function. For example, the cathode may be made of one or more materials selected from the group consisting of metals such as magnesium (Mg), silver (Ag), and aluminum (Al) and alloys thereof, but is not limited thereto.

Meanwhile, the display panel 120 may be classified into a top emission type or a bottom emission type according to a transmission direction of light emitted from the organic light emitting element.

In the top emission type, light emitted from the organic light emitting element is discharged toward the upper side of the substrate 121 on which the organic light emitting element is formed. If the display panel 120 is of top emission type, a reflective layer may be further provided under the anode. This is to discharge light emitted from the organic light emitting element toward the upper side of the substrate 121, i.e., toward the cathode.

In the bottom emission type, light emitted from the organic light emitting element is discharged toward the lower side of the substrate 121 on which the organic light emitting element is formed. If the display panel 120 is of bottom emission type, the anode may be made of a transparent conductive material only and the cathode may be made of a metal material having high reflectivity. This is to discharge light emitted from the organic light emitting element toward the lower side of the substrate 121.

Hereafter, for convenience of description, the display device 100 according to an embodiment of the present disclosure will be described as a bottom emission type display device, but is not limited thereto.

In the pixel unit 123, a circuit for driving organic light emitting elements is disposed. The circuit may be composed of a TFT, a storage capacitor, a gate line, a data line, a power line, etc. The components of the circuit may be changed variously depending on the design of the display device 100.

The encapsulation layer 124 covering the pixel unit 123 is disposed on the pixel unit 123. The encapsulation layer 124 seals the organic light emitting elements of the pixel unit 123. The encapsulation layer 124 may protect the organic light emitting elements of the pixel unit 123 against external moisture, oxygen, impacts, and the like. The encapsulation layer 124 may be formed by alternately laminating a plurality of inorganic layers and a plurality of organic layers. For example, the inorganic layers may be made of inorganic materials such as silicon nitride (SiNx), silicon oxide (SiOx), and aluminum oxide (AlOx), but are not limited thereto. For example, the organic layers may be made of epoxy-based or acryl-based polymers, but are not limited thereto.

The encapsulation substrate 125 is disposed on the encapsulation layer 124. The encapsulation substrate 125 protects the organic light emitting elements of the pixel unit 123 together with the encapsulation layer 124. The encapsulation substrate 125 may protect the organic light emitting elements of the pixel unit 123 against external moisture, oxygen, impacts, and the like. The encapsulation substrate 125 may be made of a metal material which has high corrosion resistance and may be easily processed into foil or thin film. Examples of the metal material may include aluminum (Al), nickel (Ni), chromium (Cr), and an alloy of iron (Fe) and Ni. Accordingly, since the encapsulation substrate 125 is made of a metal material, the encapsulation substrate 125 may be implemented in the form of an ultra-thin film and may provide high resistance to external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125. The first adhesive layer AD1 may be made of an adhesive material and may be a thermosetting or naturally-curable adhesive. For example, the first adhesive layer AD1 may be made of an optical clear adhesive (OCA), a pressure sensitive adhesive (PSA), or the like, but is not limited thereto.

The first adhesive layer AD1 may be disposed to cover the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting elements of the pixel unit 123 against external moisture, oxygen, impacts, and the like, together with the encapsulation layer 124 and the encapsulation substrate 125. Herein, the first adhesive layer AD1 may further contain a moisture absorbent. The moisture absorbent may include hygroscopic particles and may absorb moisture and oxygen from the outside to minimize permeation of moisture and oxygen into the pixel unit 123.

The back cover 110 is disposed on the encapsulation substrate 125. The back cover 110 may be disposed to be in contact with the encapsulation substrate 125 of the display panel 120 to protect the display panel 120. The back cover 110 may be made of a rigid material to protect the display panel 120.

A second adhesive member AD2 is disposed between the encapsulation substrate 125 and the back cover 110. The second adhesive member AD2 may bond the encapsulation substrate 125 and the back cover 110. The second adhesive member AD2 may be made of an adhesive material and may be a thermosetting or naturally-curable adhesive. For example, the adhesive member AD2 may be made of an optical clear adhesive (OCA), a pressure sensitive adhesive (PSA), or the like, but is not limited thereto.

A micro seal MS may be disposed on side surfaces of the display panel 120. The micro seal MS may be disposed between the substrate 121 and the back cover 110 so as to surround the side surfaces of the display panel 120. That is, side portions of the display panel 120 may be sealed by the micro seal MS. The micro seal MS may protect the display panel 120 against external moisture, oxygen, impacts, and the like. The micro seal MS may be made of a photo-curable acrylic resin, etc., but is not limited thereto.

The barrier film 170 is disposed on the front surface of the display panel 120. The barrier film 170 may protect the display panel 120 against external impacts, moisture, heat, and the like. The barrier film 170 may be made of a polymer resin which is light and unbreakable. For example, the barrier film 170 may be made of a cyclo olefin polymer (COP), but is not limited thereto. The barrier film 170 may also be made of polyimide (PI), polycarbonate (PC), polyethylene terephthalate (PET), and the like.

A third adhesive layer AD3 may be disposed between the display panel 120 and the barrier film 170. The third adhesive layer AD3 may bond the display panel 120 and the barrier film 170. The third adhesive layer AD3 may be made of an adhesive material and may be a thermosetting or naturally-curable adhesive. For example, the third adhesive layer AD3 may be made of an optical clear adhesive (OCA), a pressure sensitive adhesive (PSA), or the like, but is not limited thereto. Meanwhile, the third adhesive layer AD3 and the barrier film 170 are illustrated as separate components, but are not limited thereto. The third adhesive layer AD3 may be a component of the barrier film 170.

The polarization plate 180 is disposed on the barrier film 170. The polarization plate 180 is configured to suppress reflection and recognition of external light incident upon the display device 100. The polarization plate 180 may have a structure in which a plurality of layers is laminated.

A fourth adhesive layer AD4 may be disposed between the barrier film 170 and the polarization plate 180. The fourth adhesive layer AD4 may bond the barrier film 170 and the polarization plate 180. The fourth adhesive layer AD4 may be made of an adhesive material and may be a thermosetting or naturally-curable adhesive. For example, the fourth adhesive layer AD4 may be made of an optical clear adhesive (OCA), a pressure sensitive adhesive (PSA), or the like, but is not limited thereto. Meanwhile, the fourth adhesive layer AD4, the barrier film 170 and the polarization plate 180 are illustrated as separate components, but are not limited thereto. The fourth adhesive layer AD4 may be a component of the barrier film 170 or the polarization plate 180.

Hereinafter, the polarization plate 180 will be described in more detail with reference to FIG. 6.

Specific Structure of Polarization Plate

Figure 6:
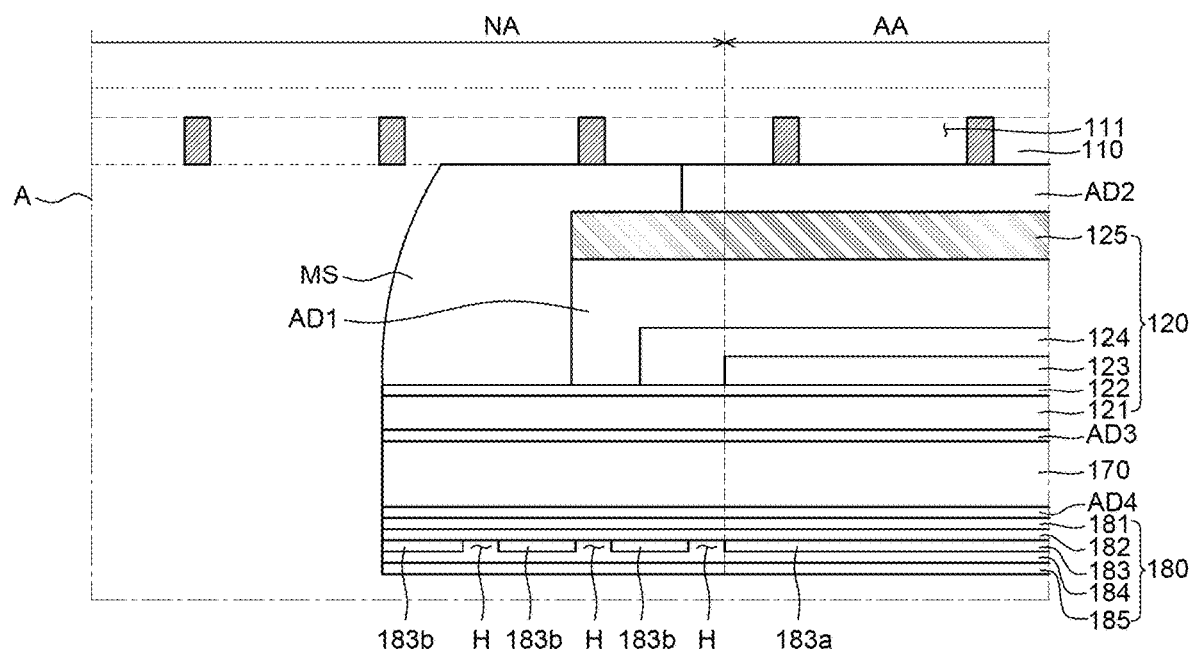
FIG. 6 is an enlarged cross-sectional view of an area A of FIG. 5.

FIG. 6 is an enlarged cross-sectional view of an area A of FIG. 5.

Referring to FIG. 6, the polarization plate 180 includes a phase delay layer 181, a first protection layer 182, a polarization layer 183, a second protection layer 184, and a surface layer 185.

The phase delay layer 181 may have a transmission axis in the range of ±45 degrees based on the angle of polarization of external light in the polarization layer 183. Thus, external light incident upon the phase delay layer 181 may be circularly polarized through the phase delay layer 181.

The polarization layer 183 may linearly polarize light incident from the outside of the display device 100. The polarization layer 183 may be formed as a stretched film of a polyvinyl alcohol (PVA)-based polymer film containing iodine or dichroic dye, but is not limited thereto.

The first protection layer 182 and the second protection layer 184 are respectively disposed on both surfaces of the polarization layer 183. The polarization layer 183 is made of a PVA-based material that absorbs moisture well. Thus, if the first protection layer 182 and the second protection layer 184 are respectively disposed on the both surfaces of the polarization layer 183, it is possible to suppress damage to the polarization layer 183 caused by heat or moisture. The first protection layer 182 and the second protection layer 184 may be made of a material having no phase difference so as not to affect a polarization state of the polarization layer 183. For example, the first protection layer 182 and the second protection layer 184 may be made of triacetyl cellulose (TAC), but is not limited thereto.

The surface layer 185 is disposed on an outermost side of the polarization plate 180 and enhances a mechanical strength of the polarization plate 180. Further, the surface layer 185 serves to suppress glare and reflection and thus improves visibility of the display device 100. The surface layer 185 may be formed as an anti-glare (AG) layer, a semi-glare (SG) layer, a low-reflection (LR) layer and an anti-glare & low-reflection (AGLR) layer formed by a surface treatment method, but is not limited thereto.

The polarization layer 183 includes a first pattern 183a and a second pattern 183b. The first pattern 183a and the second pattern 183b may be formed by patterning a layer of a material forming the polarization layer 183. Here, patterning of the polarization layer 183 may be performed only in a region corresponding to the non-active area NA of the display panel 120. If patterning of the polarization layer 183 is also performed in a region corresponding to the active area AA, the patterned regions may be recognized or polarization efficiency may decrease. Thus, patterning of the polarization layer 183 may be performed only in a region corresponding to the non-active area NA.

The first pattern 183a may correspond to the active area AA, and the second pattern 183b may correspond to the non-active area NA. That is, the first pattern 183a may overlap the active area AA of the display panel 120, and the second pattern 183b may overlap the non-active area NA of the display panel 120. Thus, the second pattern 183b may be formed to surround the first pattern 183a. In the drawing, the second pattern 183b is illustrated as including a plurality of second patterns 183b, but is not limited thereto. The second pattern 183b may be formed as a single second pattern 183b.

The first pattern 183a and the second pattern 183b may be spaced apart from each other by a hole H formed by patterning. Further, if a plurality of second patterns 183b is formed, the plurality of second patterns 183b may be spaced apart from each other by the hole H formed by patterning. That is, the first pattern 183a and the plurality of second patterns 183b may be spaced apart from each other to be disposed. Also, the hole H may be filled with the second protection layer 184 or the first protection layer 182. Since the polarization layer 183 is divided into the first pattern 183a and the second pattern 183b, moisture absorption of the polarization layer 183 may be delayed. Specifically, infiltration of moisture and oxygen may occur from the second pattern 183b, which is a side portion of the polarization plate 180, toward the first pattern 183a, which is a central portion of the polarization plate 180. Here, the divided patterns 183a and 183b of the polarization layer 183 may absorb moisture and oxygen independently of each other. Further, a moving path of moisture and oxygen may be lengthened or blocked by the protection layers 182 and 184 disposed on the hole H between the patterns 183a and 183b. Therefore, infiltration of moisture and oxygen into the region of the polarization layer 183 corresponding to the active area AA may be delayed. Also, degradation in quality and warpage caused by moisture absorption of the polarization layer 183 may be suppressed.

In general, a polarization plate of a display device includes a PVA-based polymer film as a polarization layer to polarize incident light. However, a PVA-based polymer material may decrease in modulus when exposed to moisture. Therefore, a neutral plane of a display panel is moved, which may cause an increase in stress applied to a substrate and thus results in cracks in the substrate.

Also, the PVA-based polymer material is excellent in moisture absorption and thus changes in volume depending on the humidity. That is, the polarization layer may absorb moisture and expand in a high-humidity environment, and may discharge moisture and contract in a low-humidity environment. Thus, warpage occurs in a stretching direction of the polarization layer. Accordingly, warpage occurs in the polarization plate and the display panel to which the polarization plate is attached.

However, in the display device 100 according to an exemplary embodiment of the present disclosure, a portion of the polarization layer 183 corresponding to the non-active area NA is patterned to delay moisture absorption. Specifically, the polarization layer 183 may be patterned so that the first pattern 183a corresponding to the active area AA and the second pattern 183b corresponding to the non-active area NA are spaced apart from each other. Also, the second pattern 183b may be disposed to surround the first pattern 183a. Thus, even if moisture or oxygen infiltrates through side portions of the polarization plate 180, the second pattern 183b disposed on a side portion of the polarization layer 183 may independently absorb moisture. Therefore, moisture absorption of the first pattern 183a may be delayed. Here, the second pattern 183b is a part of the polarization layer 183 corresponding to the non-active area NA. Thus, most of the polarization layer 183 is formed as the first pattern 183a. Therefore, the second pattern 183b may suppress overall deformation and warpage of the polarization layer 183.

Also, in the display device 100 according to an exemplary embodiment of the present disclosure, the protection layers 182 and 184 may be disposed on the hole H between the first pattern 183a and the second pattern 183b of the polarization layer 183. That is, the first pattern 183a and the second pattern 183b may be spaced apart from each other by the protection layers 182 and 184. Thus, the protection layers 182 and 184 may block moisture or oxygen flowing from the second pattern 183b toward the first pattern 183a or lengthen a moving path thereof. Therefore, it is possible to minimize infiltration of moisture or oxygen into the first pattern 183a.

Further, in the display device 100 according to an exemplary embodiment of the present disclosure, a plurality of second patterns 183b may be formed, and the plurality of second patterns 183b may be spaced apart from each other by the protection layers 182 and 184. That is, moisture absorption of the plurality of second patterns 183b may occur sequentially from the second pattern 183b disposed on an outer side of the polarization layer 183 toward the second pattern 183b adjacent to the first pattern 183a. Furthermore, the protection layers 182 and 184 may be disposed between a plurality of second patterns 183b adjacent to each other to minimize the progress of moisture absorption from the outside of the plurality of second patterns 183b toward the first pattern 183a. Thus, moisture absorption and deformation of the first pattern 183a may be suppressed. Therefore, it is possible to suppress a decrease in modulus of the polarization layer 183 and suppress cracks in the substrate 121. Also, it is possible to minimize warpage of the polarization layer 183 and suppress warpage of the display panel 120. Moreover, it is possible to suppress deformation of the polarization layer 183 and thus possible to improve the display quality and reliability of the display device 100.

Pattern Structure of Polarization Layer

FIG. 7A through FIG. 7E are plan views of a polarization layer according to various exemplary embodiments of the present disclosure. FIG. 7A through FIG. 7E illustrate only one corner of the polarization layer 183 and its adjacent partial region for convenience in explanation, the same structure may be applied to the other non-illustrated regions. Meanwhile, any one or a combination of the structures of the polarization layer 183 shown in FIG. 7A through FIG. 7E may be applied to the polarization layer 183 shown in FIG. 6. However, the present disclosure is not limited thereto. As long as a region of the polarization layer 183 corresponding to the non-active area NA is patterned, various pattern structures may be applied.

Figure 7A:
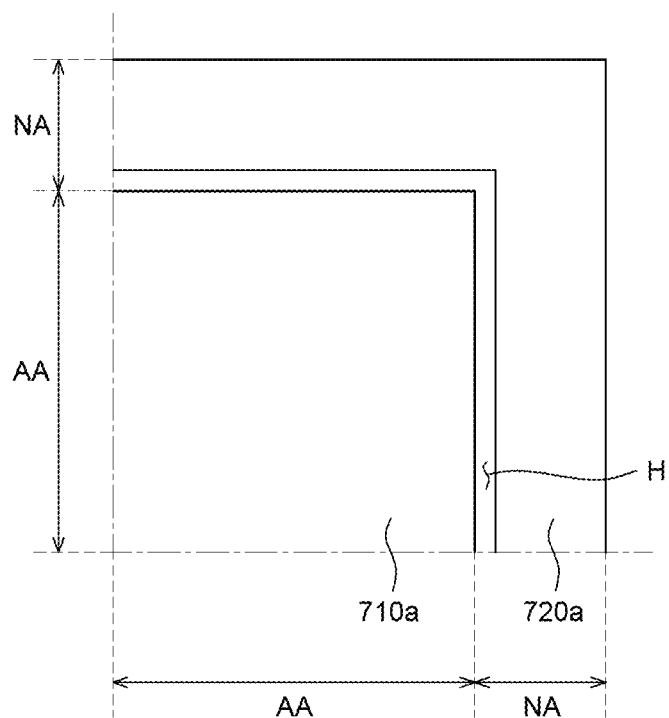
FIG. 7A through FIG. 7E are plan views of a polarization layer according to various exemplary embodiments of the present disclosure.

Referring to FIG. 7A, the polarization layer 183 includes a first pattern 710a and a second pattern 720a. The first pattern 710a may correspond to the active area AA of the display panel 120, and the second pattern 720a may correspond to the non-active area NA of the display panel 120. The second pattern 720a may be disposed to surround the first pattern 710a. Particularly, the second pattern 720a may have a closed loop shape. The first pattern 710a and the second pattern 720a may be spaced apart from each other by a hole H. Also, the hole H between the first pattern 710a and the second pattern 720a may have a closed loop shape. Further, although not illustrated in the drawings, any one of the protection layers 182 and 184 disposed on the hole H may have a closed loop shape. Thus, even if moisture and oxygen infiltrate into the polarization plate 180, the second pattern 720a corresponding to the non-active area NA may first absorb moisture independently. Also, even if moisture and oxygen infiltrate into the hole H, the protection layers 182 and 184 inside the hole H may block such infiltration and lengthen a moving path of moisture and oxygen. Therefore, the second pattern 720a and the hole H serve as a barrier and thus minimize moisture absorption of the first pattern 710a.

Figure 7B:
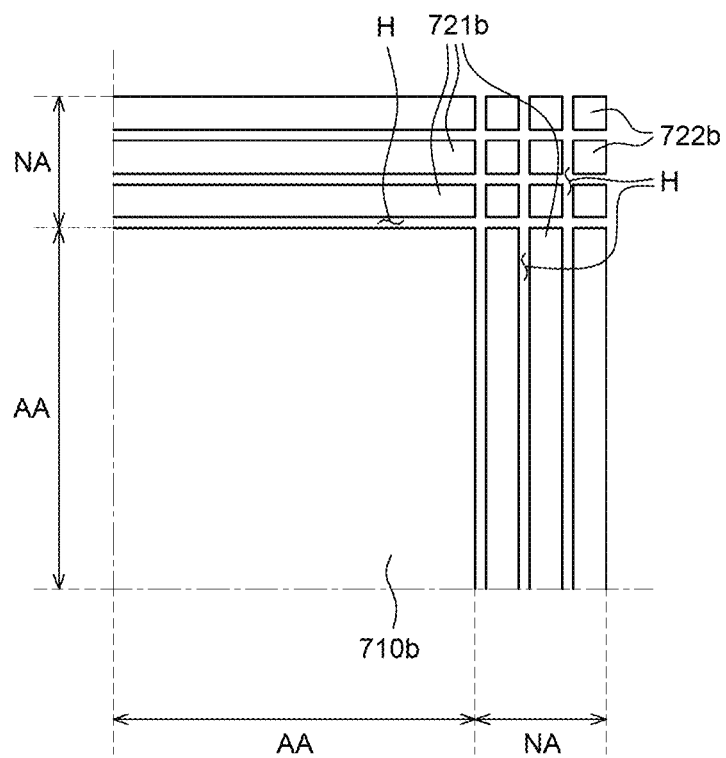

Referring to FIG. 7B, the polarization layer 183 includes a first pattern 710b and second patterns 721b and 722b. The first pattern 710a may correspond to the active area AA of the display panel 120, and the second patterns 721b and 722b may correspond to the non-active area NA of the display panel 120. The second patterns 721b and 722b may include a plurality of first sub-patterns 721b and a plurality of second sub-patterns 722b. The plurality of first sub-patterns 721b may be disposed so as to correspond to edges of the first pattern 710b. The plurality of first sub-patterns 721b may have a line shape. The plurality of second sub-patterns 722b may be disposed between the plurality of first sub-patterns 721b so as to correspond to a corner of the first pattern 710b. The plurality of second sub-patterns 722b may have a dot shape. The plurality of first sub-patterns 721b and the plurality of second sub-patterns 722b may be disposed to surround the first pattern 710b. The plurality of first sub-patterns 721b and the plurality of second sub-patterns 722b may be disposed in a plurality of rows or a plurality of columns. The first pattern 710b, the plurality of first sub-patterns 721b and the plurality of second sub-patterns 722b may be spaced apart from each other by a hole H. Further, the hole H may be formed into a plurality of lines disposed in rows or columns.

Meanwhile, the numbers and shapes of the plurality of first sub-patterns 721b and the plurality of second sub-patterns 722b shown in FIG. 7B may be variously changed as necessary.

If moisture and oxygen infiltrate into the polarization plate 180, moisture absorption may independently occur in some of the plurality of first sub-patterns 721b and the plurality of second sub-patterns 722b disposed on an outermost side. Also, the plurality of first sub-patterns 721b and the plurality of second sub-patterns 722b are disposed in a plurality of rows or a plurality of columns, and, thus, the spread of moisture and oxygen may be further delayed. Here, the plurality of first sub-patterns 721b and the plurality of second sub-patterns 722b may be spaced apart from each other by the hole H formed into a plurality of lines disposed in rows or columns. Thus, the protection layers 182 and 184 inside the hole H may block infiltration of moisture and oxygen and lengthen a moving path of moisture and oxygen. Therefore, the plurality of first sub-patterns 721b, the plurality of second sub-patterns 722b and the hole H serve as a barrier and thus minimize moisture absorption of the first pattern 710b.

Figure 7C:
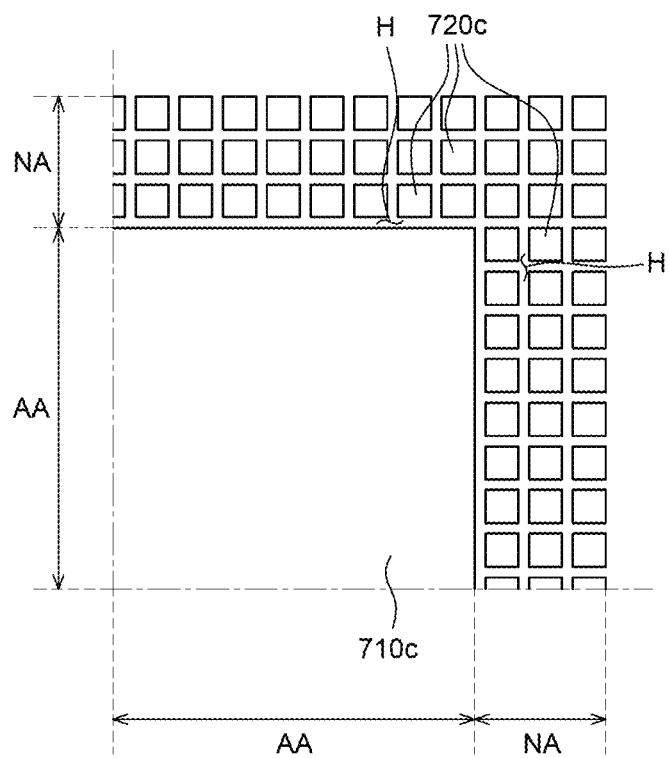

Referring to FIG. 7C, the polarization layer 183 includes a first pattern 710c and a plurality of second patterns 720c. The first pattern 710c may correspond to the active area AA of the display panel 120, and the plurality of second patterns 720c may correspond to the non-active area NA of the display panel 120. The plurality of second patterns 720c may be formed into a dot shape. The plurality of second patterns 720c may be disposed to surround the first pattern 710c. The plurality of second patterns 720c may be disposed in a plurality of rows or a plurality of columns. The first pattern 710c and the plurality of second patterns 720c may be spaced apart from each other by a hole H. Further, the hole H may be formed into a plurality of lines disposed in rows or columns.

Meanwhile, although the plurality of second patterns 720c is illustrated as being identical to each other in the drawing, the plurality of second patterns 720c may be formed in various sizes. Also, the plurality of second patterns 720c may be divided into a plurality of first sub-patterns corresponding to edges of the first pattern 710c and a plurality of second sub-patterns corresponding to a corner of the first pattern 710c. Further, the number and shape of the plurality of second patterns 720c shown in FIG. 7C may be variously changed as necessary.

If moisture and oxygen infiltrate into the polarization plate 180, moisture absorption may independently occur in some of the plurality of second patterns 720c disposed on an outermost side. Also, the plurality of second patterns 720c is disposed in a plurality of rows or a plurality of columns, and, thus, the spread of moisture and oxygen may be further delayed. Here, the plurality of second patterns 720c may be spaced apart from each other by the hole H formed into a plurality of lines disposed in rows or columns. Thus, the protection layers 182 and 184 inside the hole H may block infiltration of moisture and oxygen and lengthen a moving path of moisture and oxygen. Therefore, the plurality of second patterns 720c and the hole H serve as a barrier and thus minimize moisture absorption of the first pattern 710c.

Figure 7D:
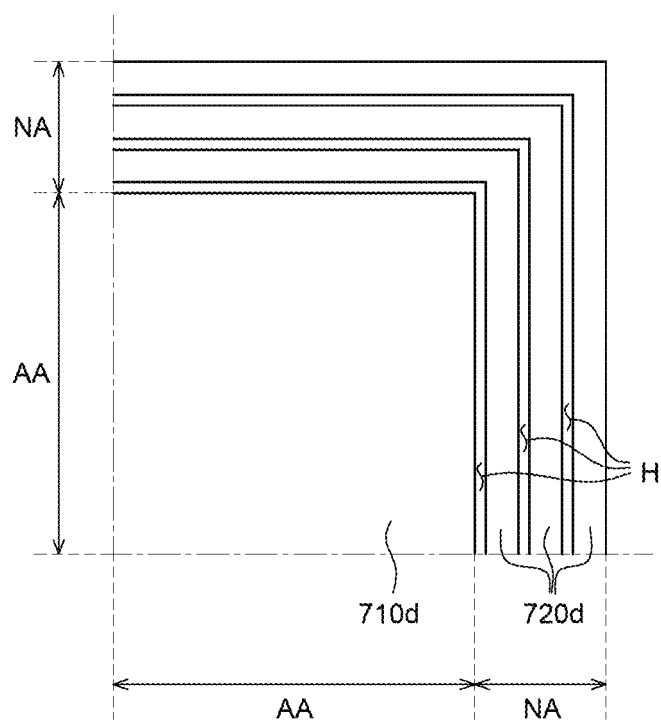

Referring to FIG. 7D, the polarization layer 183 includes a first pattern 710d and a plurality of second patterns 720d. Each of the plurality of second patterns 720d may also be referred to as a sub-pattern. The first pattern 710*d* may correspond to the active area AA of the display panel 120, and the plurality of second patterns 720*d* may correspond to the non-active area NA of the display panel 120. Each of the plurality of second patterns 720*d* may be disposed to surround the first pattern 710*d*. Particularly, each of the plurality of second patterns 720*d* may have a closed loop shape. That is, the plurality of second patterns 720*d* each formed into a closed loop shape may be sequentially disposed to be away from the first pattern 710*d*. The first pattern 710*d* and the plurality of second patterns 720*d* may be spaced apart from each other by a plurality of holes H. Also, the plurality of holes H between the first pattern 710*d* the plurality of second patterns 720*d* may have a closed loop shape. Further, although not illustrated in the drawings, any one of the protection layers 182 and 184 disposed on the holes H may have a closed loop shape.

Meanwhile, the number and shape of the plurality of second patterns 720*d* shown in FIG. 7D may be variously changed as necessary.

If moisture and oxygen infiltrate into the polarization plate 180, moisture absorption may independently occur in the second patterns 720*d* disposed on an outermost side. Also, due to the placement of the plurality of second patterns 720*d*, the spread of moisture and oxygen may be further delayed. Here, the plurality of second patterns 720*d* may be spaced apart from each other by the plurality of holes H. Thus, the protection layers 182 and 184 inside the holes H may block infiltration of moisture and oxygen and lengthen a moving path of moisture and oxygen. Particularly, the plurality of holes H as well as the plurality of second patterns 720*d* has a closed loop shape, and, thus, moisture and oxygen may be trapped within the closed loops. Thus, the spread of moisture and oxygen may be more effectively delayed. Therefore, the plurality of second patterns 720*d* and the plurality of holes H serve as a barrier and thus minimize moisture absorption of the first pattern 710*d*.

Figure 7E:
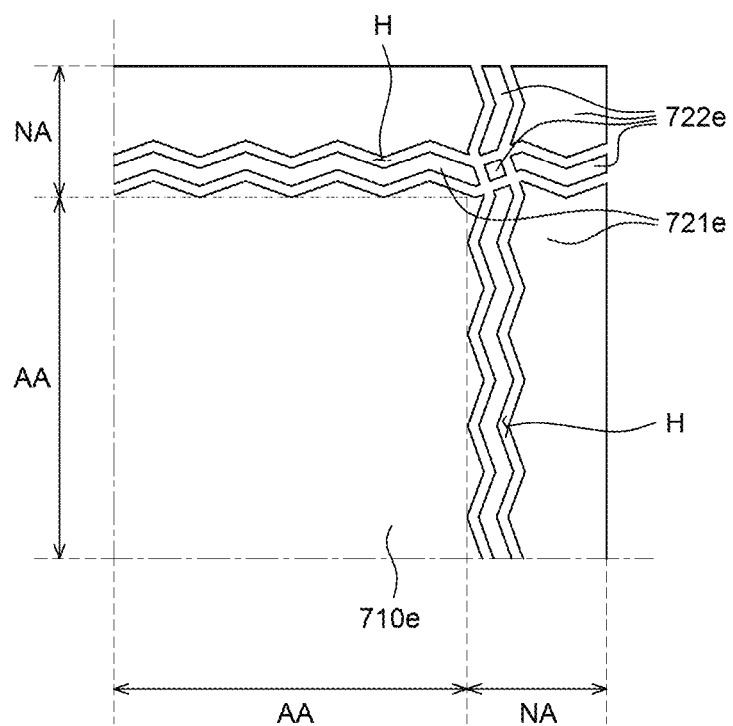

Referring to FIG. 7E, the polarization layer 183 includes a first pattern 710*e* and second patterns 721*e* and 722*e*. The first pattern 710*e* may correspond to the active area AA of the display panel 120, and the second patterns 721*e* and 722*e* may correspond to the non-active area NA of the display panel 120. The second patterns 721*e* and 722*e* may include a plurality of first sub-patterns 721*e* and a plurality of second sub-patterns 722*e*. The plurality of first sub-patterns 721*e* may be disposed so as to correspond to edges of the first pattern 710*e*. The plurality of second sub-patterns 722*e* may be disposed between the plurality of first sub-patterns 721*e* so as to correspond to a corner of the first pattern 710*e*. At least some of outlines of the plurality of first sub-patterns 721*e* and outlines of the plurality of second sub-patterns 722*e* may have a zigzag shape. The plurality of first sub-patterns 721*e* and the plurality of second sub-patterns 722*e* may be disposed to surround the first pattern 710*e*. The plurality of first sub-patterns 721*e* and the plurality of second sub-patterns 722*e* may be disposed in a plurality of rows or a plurality of columns. The first pattern 710*e*, the plurality of first sub-patterns 721*e* and the plurality of second sub-patterns 722*e* may be spaced apart from each other by a hole H. Also, the hole H may be formed into a plurality of lines each having a zigzag outline and disposed in rows or columns.

Meanwhile, the numbers and shapes of the plurality of first sub-patterns 721*e* and the plurality of second sub-patterns 722*e* shown in FIG. 7E may be variously changed as necessary.

If moisture and oxygen infiltrate into the polarization plate 180, moisture absorption may independently occur in some of the plurality of first sub-patterns 721*e* and the plurality of second sub-patterns 722*e* disposed on an outermost side. Also, the plurality of first sub-patterns 721*e* and the plurality of second sub-patterns 722*e* are disposed in a plurality of rows or a plurality of columns, and, thus, the spread of moisture and oxygen may be further delayed. Here, the plurality of first sub-patterns 721*e* and the plurality of second sub-patterns 722*e* may be spaced apart from each other by the hole H formed into a plurality of lines disposed in rows or columns. Thus, the protection layers 182 and 184 inside the hole H may block infiltration of moisture and oxygen and lengthen a moving path of moisture and oxygen. Particularly, the hole H as well as the plurality of first sub-patterns 721*e* and the plurality of second sub-patterns 722*e* has a zigzag shape, and, thus, the moving path of moisture and oxygen may be further lengthened. Therefore, the plurality of first sub-patterns 721*e*, the plurality of second sub-patterns 722*e* and the hole H serve as a barrier and thus minimize moisture absorption of the first pattern 710*e*.

Deformation of Barrier Film

Figure 8:
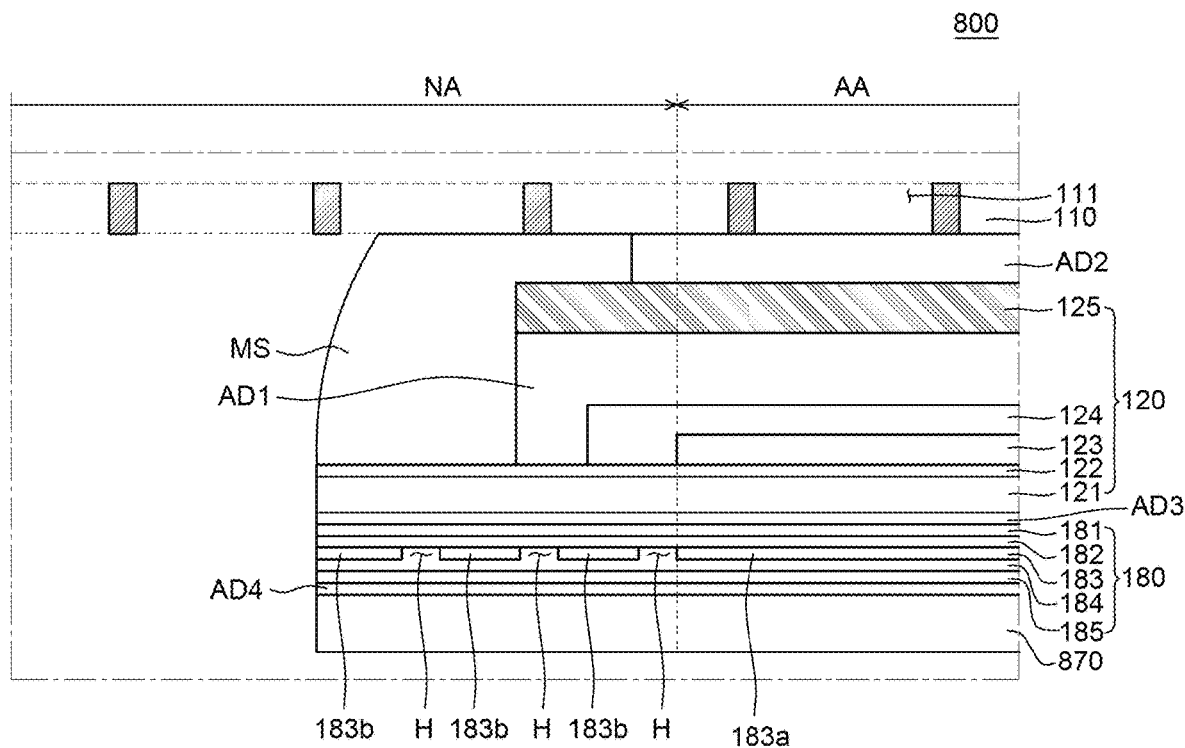
FIG. 8 is an enlarged cross-sectional view of a display part of a display device according to another exemplary embodiment of the present disclosure.

FIG. 8 is an enlarged cross-sectional view of a display part of a display device according to another exemplary embodiment of the present disclosure. A display device 800 shown in FIG. 8 has substantially the same configuration as the display device 100 shown in FIG. 5 and FIG. 6 except the positions of the polarization plate 180 and a barrier film 870. Thus, a repeated description will be omitted.

Referring to FIG. 8, the polarization plate 180 is disposed on the front surface of the display panel 120. Also, the barrier film 870 is disposed on the polarization plate 180. That is, the barrier film 870 may be disposed on an outermost side of the display panel 120. The barrier film 870 may protect the display panel 120 against external impacts, moisture, heat, and the like. The barrier film 870 may be made of a polymer resin which is light and unbreakable. For example, the barrier film 870 may be made of a cyclo olefin polymer (COP), but is not limited thereto. The barrier film 870 may also be made of polyimide (PI), polycarbonate (PC), polyethylene terephthalate (PET), and the like.

In the display device 800 according to another exemplary embodiment of the present disclosure, the barrier film 870 is disposed to cover the polarization plate 180 and thus more effectively protect the polarization plate 180. Specifically, the barrier film 870 may minimize moisture permeation occurring through a front surface of the polarization plate 180. Thus, it is possible to minimize moisture absorption of the polarization layer 183 and suppress warpage of the polarization layer 183. Therefore, it is possible to suppress warpage of the display panel 120 and improve reliability of the display device 800.

Figure 9:
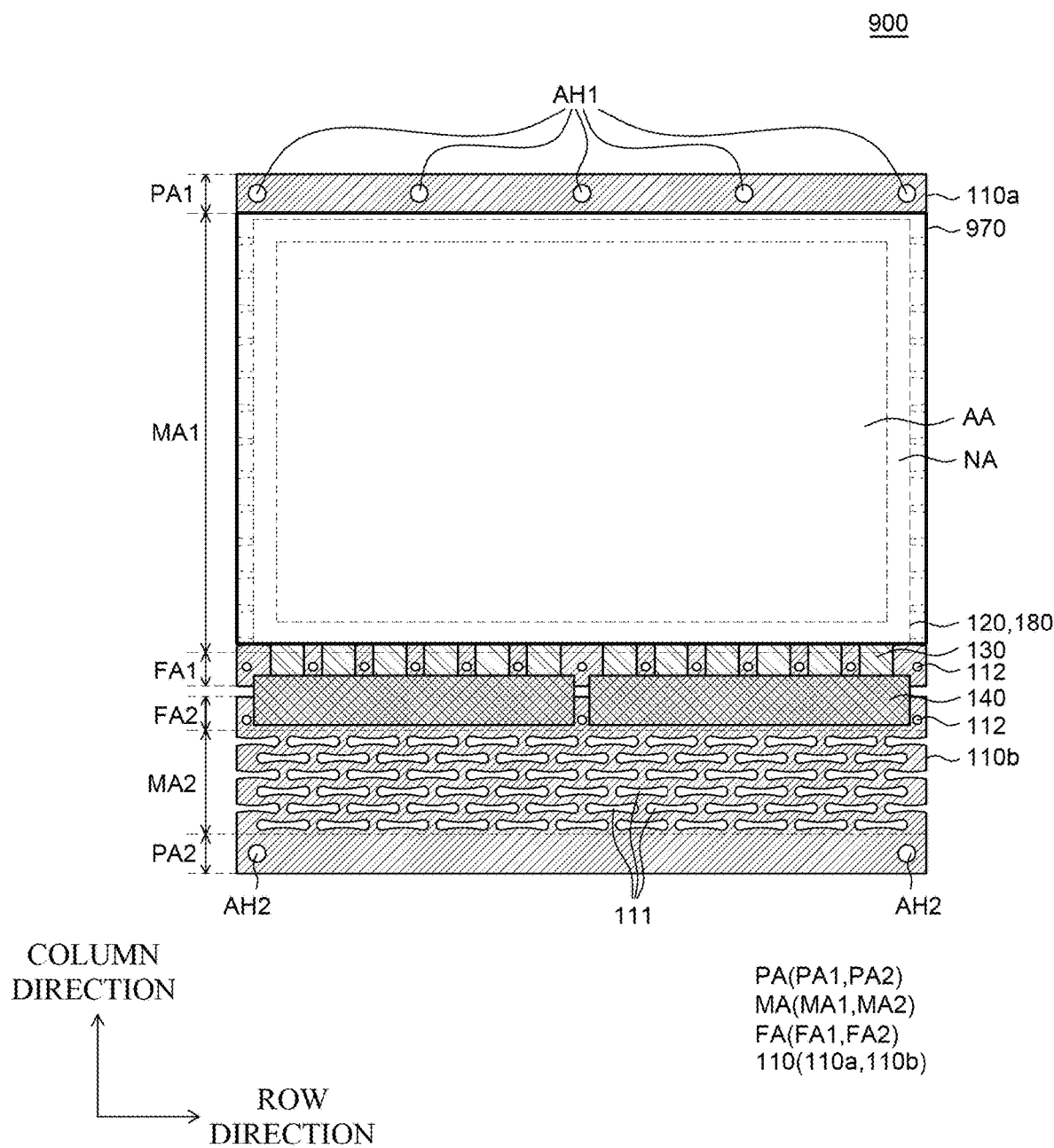
FIG. 9 is a plan view of a display part of a display device according to yet another exemplary embodiment of the present disclosure.
Figure 10:
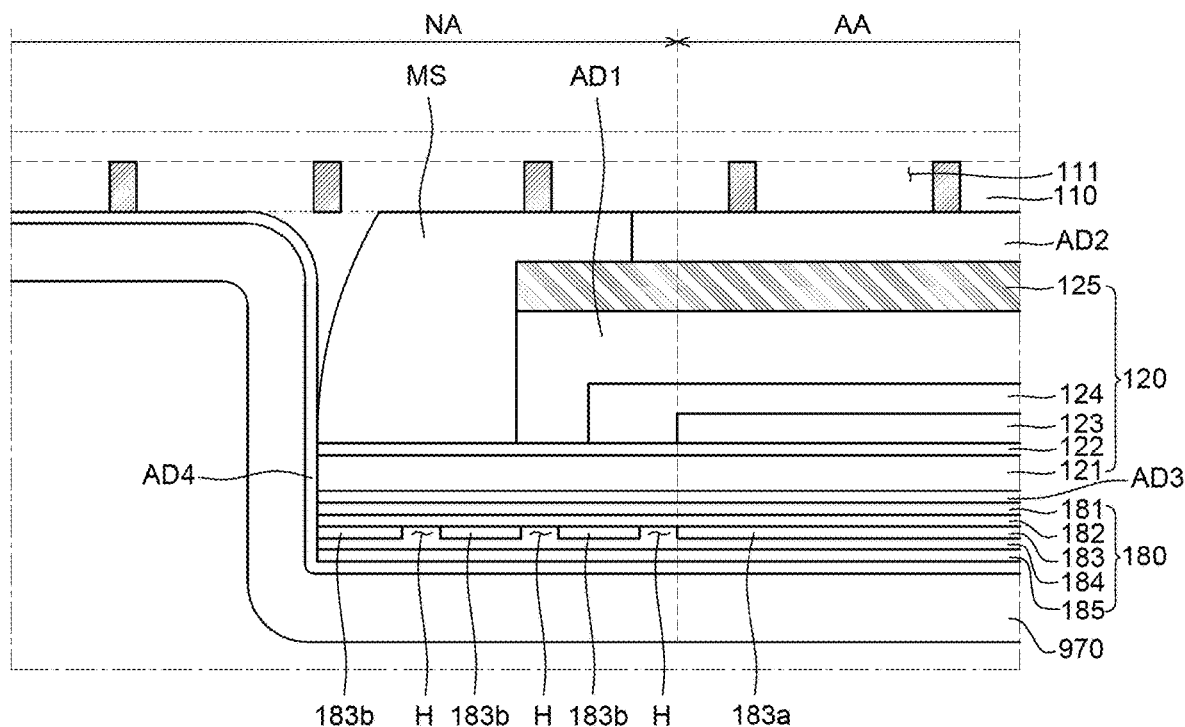
FIG. 10 is an enlarged cross-sectional view of the display part of the display device according to still another exemplary embodiment of the present disclosure.

FIG. 9 is a plan view of a display part of a display device according to yet another exemplary embodiment of the present disclosure. FIG. 10 is an enlarged cross-sectional view of the display part of the display device according to still another exemplary embodiment of the present disclosure. A display device 900 shown in FIG. 9 and FIG. 10 has substantially the same configuration as the display device 800 shown in FIG. 8 except a barrier film 970. Thus, a repeated description will be omitted.

Referring to FIG. 9 and FIG. 10, the barrier film 970 may be extended to one surface of the back cover 110 while covering side surfaces of the display panel 120 and the polarization plate 180. Herein, the one surface of the back cover 110 may refer to a surface on which the display panel 120 is disposed.

The barrier film 970 may be extended to cover a part of the side portions of the display panel 120 and the polarization plate 180. Specifically, the barrier film 970 may be extended to cover the side portions of the display panel 120 and the polarization plate 180 from sides other than one side of the display panel 120 where the flexible film 130 is disposed. That is, the barrier film 970 may cover three side portions on the top, left and right sides of four sides of the display panel 120 shown in FIG. 9. Since the barrier film 970 is not disposed in a region where the flexible film 130 is disposed, interference between the barrier film 970 and the flexible film 130 may be minimized. Also, the barrier film 970 may be extended to the one surface of the back cover 110 from the side portions of the display panel 120 and the polarization plate 180, but is not limited thereto. The barrier film 970 may be extended to cover only the side portions of the display panel 120 and the polarization plate 180.

In the display device 900 according to yet another exemplary embodiment of the present disclosure, the barrier film 970 covers a part of the side portions of the display panel 120 and the polarization plate 180. Thus, the part of the side portions of the display panel 120 and the polarization plate 180 may be completely surrounded by the barrier film 970, the back cover 110, the micro seal MS and the second adhesive layer AD2. Therefore, the barrier film 970 may minimize moisture permeation occurring through the side portions of the display panel 120 and the polarization plate 180.

Further, if the barrier film 970 disposed at the side portions of the display panel 120 and the polarization plate 180 is extended to the one surface of the back cover 110, moisture permeation may be more effectively suppressed. That is, the barrier film 970 is extended along the one surface of the back cover 110, and, thus, the sealing effect for the display panel 120 and the polarization plate 180 may be increased. Furthermore, a moisture permeation path may be further increased along a contact surface between the barrier film 970 and the back cover 110. Therefore, it is possible to more effectively suppress moisture permeation occurring through the display panel 120 and the polarization plate 180.

Also, even if moisture permeation occurs through the side portions of the polarization plate 180, the second pattern 183b spaced apart from the first pattern 183a and surrounding the first pattern 183a may be disposed on an outside of the polarization layer 183. Therefore, moisture absorption may independently occur in the second pattern 183b, and moisture absorption in the first pattern 183a may be delayed and suppressed. Accordingly, it is possible to suppress deformation of the polarization layer 183 and also possible to suppress cracks in the substrate 121 and warpage of the display panel 120.

Moisture Absorption Test on Polarization Layer

Figure 11A:
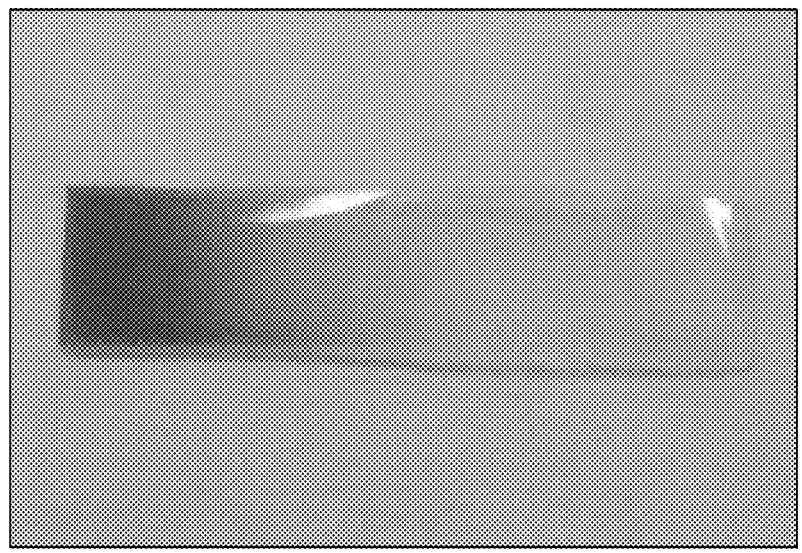
FIG. 11A and FIG. 11B show moisture absorption test results on polarization layers according to a comparative embodiment and an embodiment, respectively.
Figure 11B:
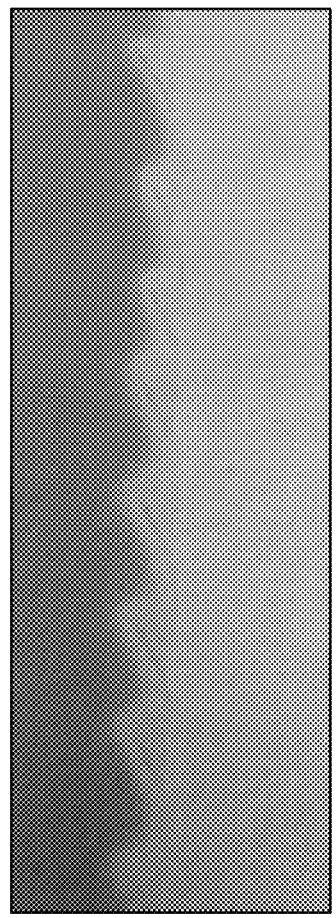

FIG. 11A and FIG. 11B show moisture absorption test results on polarization layers according to a comparative embodiment and an embodiment, respectively. FIG. 11A shows a moisture absorption test result on a polarization layer according to the comparative embodiment, and FIG. 11B shows a moisture absorption test result on a polarization layer according to the embodiment. A non-patterned polarization layer was applied to the comparative embodiment, and a polarization layer having a zigzag pattern similar to the pattern shown in FIG. 7E was applied to the embodiment. Also, moisture absorption progressed from the right side to the left side of the polarization layer. Thus, a part of the polarization layer where moisture is absorbed is transparent, and a normal part of the polarization layer where moisture is not absorbed has a dark color.

Referring to FIG. 11A, it may be seen that there is a difference between a normal part on the left side and a moisture-absorbed part on the right side due to moisture absorption of the polarization layer. That is, it may be seen that deformation of the polarization layer occurs along a progress direction of moisture absorption. Particularly, it may be seen that the polarization layer is not patterned, and, thus, deformation expands gradually in a middle part between the normal part and the moisture-absorbed part and most of the polarization layer absorbs moisture.

Referring to FIG. 11B, it may be seen that there is a distinct boundary between a normal pattern on the left side and a moisture-absorbed pattern on the right side. That is, the polarization layer according to the embodiment is patterned, and, thus, the left pattern and the right pattern may be spaced apart from each other. Therefore, even if moisture absorption occurs, moisture absorption occurs independently in the right pattern, and, thus, it is possible to suppress expansion of moisture absorption to the left pattern. Accordingly, moisture absorption over the entire polarization layer may be delayed, and, thus, warpage of the polarization layer may be suppressed.

The exemplary embodiments of the present disclosure can also be described as follows:

According to an aspect of the present disclosure, the display device includes a display panel including an active area and a non-active area; and a polarization plate on the display panel, the polarization plate including a polarization layer. The polarization layer includes a first pattern corresponding to the active area and a second pattern corresponding to the non-active area, and the second pattern is spaced apart from the first pattern.

The second pattern may be disposed to surround the first pattern.

The second pattern may include a plurality of sub-patterns, and one or more of the plurality of sub-patterns may have a closed loop shape surrounding the first pattern.

The second pattern may include a plurality of first sub-patterns corresponding to edges of the first pattern; and a plurality of second sub-patterns disposed between ends of the plurality of first sub-patterns and corresponding to a corners of the first pattern.

The plurality of first sub-patterns may have a line shape, and the plurality of second sub-patterns may have a dot shape.

The plurality of first sub-patterns and the plurality of second sub-patterns may have a dot shape.

The plurality of first sub-patterns may have outlines and the plurality of second sub-patterns may have outlines, at least one of the outlines of the plurality of first sub-patterns and at least one of the outlines of the plurality of second sub-patterns having a zigzag shape.

The display device may further include a back cover on a rear surface of the display panel; and a barrier film on the polarization plate.

The barrier film may cover at least a part of side portions of the polarization plate and at least a part of side portions of the display panel.

The display panel may have a first side and a plurality of second sides different from the first side. The display device may further include a flexible film on the first side of the display panel. The barrier film may cover the side portions of the polarization plate and the side portions of the display panel on the plurality of second sides.

The barrier film may be in contact with one surface of the back cover.

The display device may further include a roller coupled to the display panel and configured to wind or unwind the display panel and the back cover.

The polarization plate may further include protection layers respectively disposed on opposite surfaces of the polarization layer. The first pattern and the second pattern may be spaced apart from each other by at least one of the protection layers.

According to another aspect of the present disclosure, the display device includes a display panel including an active area and a non-active area; a polarization plate on the display panel, the polarization plate including a polarization layer; protection layers respectively disposed on opposite surfaces of the polarization layer; and a roller coupled to the display panel and configured to wind or unwind the display panel. The polarization layer includes a first pattern corresponding to the active area, and a second pattern corresponding to the non-active area and surrounding the first pattern. The first pattern and the second pattern are spaced apart from each other by at least one of the protection layers.

The second pattern may include a plurality of sub-patterns, and one or more of the plurality of sub-patterns may have a closed loop shape surrounding the first pattern.

The protection layers between the first pattern and the second pattern may have a closed loop shape.

The second pattern may include a plurality of sub-patterns, and at least one of the plurality of sub-patterns may have a line shape or a dot shape.

The second pattern may include a plurality of sub-patterns each having outlines, and at least one of the outlines of the plurality of sub-patterns may have a zigzag shape.

The display device may further include a back cover on a rear surface of the display panel; and a barrier film on the polarization plate.

The barrier film may extend to one surface of the back cover and may covers a part of side surfaces of the display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
a display panel including an active area and a non-active area; and
a polarization plate on the display panel, the polarization plate including a polarization layer and protection layers respectively disposed on opposite surfaces of the polarization layer,
wherein the polarization layer includes a first pattern corresponding to the active area and a second pattern corresponding to the non-active area,
wherein the first pattern is continuous and planar across the first pattern and the second pattern is spaced apart from the first pattern, the second pattern being different from the first pattern,
wherein the first pattern and the second pattern are spaced apart from each other by at least one of the protection layers, and
wherein the polarization layer is a polyvinyl alcohol (PVA)-based polymer film.

2. The display device according to claim 1, wherein the second pattern is disposed to surround the first pattern.

3. The display device according to claim 1, wherein the second pattern includes a plurality of sub-patterns, the display device further comprising:
a plurality of holes between the plurality of sub-patterns, wherein the plurality of sub-patterns each have a closed loop shape surrounding the first pattern and are sequentially disposed by the plurality of holes further away from the first pattern than a preceding one of the plurality of sub-patterns.

4. The display device according to claim 1, wherein the second pattern includes:
a plurality of first sub-patterns corresponding to edges of the first pattern; and
a plurality of second sub-patterns disposed between ends of the plurality of first sub-patterns and corresponding to corners of the first pattern,
wherein the plurality of second sub-patterns at the corners of the first pattern are different in shape and arrangement from the plurality of first sub-patterns at the edges of the first pattern, and
wherein each of the plurality of first sub-patterns and each of the plurality of second sub-patterns are different from the first pattern.

5. The display device according to claim 4, wherein the plurality of first sub-patterns has a line shape, and
wherein the plurality of second sub-patterns has a dot shape.

6. The display device according to claim 4, wherein the plurality of first sub-patterns have outlines and the plurality of second sub-patterns have outlines, at least one of the outlines of the plurality of first sub-patterns and at least one of the outlines of the plurality of second sub-patterns having a zigzag shape.

7. The display device according to claim 1, wherein the second pattern includes a plurality of sub-patterns each having a dot shape and spaced from each other in successive rows and columns with each row and column being spaced further from the first pattern than a preceding row and column.

8. The display device according to claim 1, further comprising:
a back cover on a rear surface of the display panel; and
a barrier film on the polarization plate.

9. The display device according to claim 8, wherein the barrier film covers at least a part of side portions of the polarization plate and at least a part of side portions of the display panel.

10. The display device according to claim 9, wherein the display panel has a first side and a plurality of second sides different from the first side, the display device further comprising:
a flexible film on the first side of the display panel,
wherein the barrier film covers the side portions of the polarization plate and the side portions of the display panel on the plurality of second sides.

11. The display device according to claim 8, wherein the barrier film is in contact with one surface of the back cover.

12. The display device according to claim 8, further comprising:
a roller coupled to the display panel and configured to wind or unwind the display panel and the back cover.

13. The display device according to claim 1, wherein the protection layers include a first protection layer and a second protection layer, and wherein the polarization plate is a multi-layer stack that includes, in sequential order:
a phase delay layer;
the first protection layer;
the polarization layer;
the second protection layer; and
a surface layer.

14. A display device, comprising:
a display panel including an active area and a non-active area;
a polarization plate on the display panel, the polarization plate including a polarization layer and protection layers respectively disposed on opposite surfaces of the polarization layer in sequential order in a multi-layer stack; and
a roller coupled to the display panel and configured to wind or unwind the display panel,
wherein the polarization layer includes a first pattern corresponding to the active area, and a second pattern corresponding to the non-active area and surrounding the first pattern,
wherein the first pattern and the second pattern are spaced apart from each other by at least one of the protection layers,
wherein the polarization layer is a polyvinyl alcohol (PVA)-based polymer film, and
wherein an entirety of the first pattern is continuous and absent of spacing and the second pattern is different from the first pattern.

15. The display device according to claim 14, wherein the second pattern includes a plurality of sub-patterns, and wherein one or more of the plurality of sub-patterns have a closed loop shape surrounding the first pattern, the display device further comprising:
at least one hole in the polarization layer between the first pattern and the second pattern, the first pattern and the second pattern spaced apart by the at least one hole,
wherein the polarization layer is a single layer and the at least one is hole is only through the polarization layer and is absent from any other layer in the multi-layer stack of the polarization plate.

16. The display device according to claim 15, wherein the protection layers between the first pattern and the second pattern have a closed loop shape.

17. The display device according to claim 14, wherein the second pattern includes a plurality of sub-patterns, and wherein at least one of the plurality of sub-patterns have a line shape or a dot shape.

18. The display device according to claim 14, wherein the second pattern includes a plurality of sub-patterns each having outlines, and
wherein at least one of the outlines of the plurality of sub-patterns have a zigzag shape.

19. The display device according to claim 14, further comprising:
a back cover on a rear surface of the display panel; and
a barrier film on the polarization plate.

20. The display device according to claim 19, wherein the barrier film extends to one surface of the back cover and covers a part of side surfaces of the display panel.

21. The display device according to claim 14, wherein the second pattern includes a plurality of sub-patterns that are spaced apart from each other by a plurality of holes, and
wherein the at least one of the protection layers fills the plurality of holes between the spaced apart plurality of sub-patterns of the second pattern.

* * * * *